US007863945B2

(12) United States Patent
Okada

(10) Patent No.: US 7,863,945 B2
(45) Date of Patent: Jan. 4, 2011

(54) CURRENT CONVERTING METHOD, TRANSCONDUCTANCE AMPLIFIER AND FILTER CIRCUIT USING THE SAME

(75) Inventor: Hiroyuki Okada, Minato-ku (JP)

(73) Assignee: NEC Corporation, Tokyo (JP)

( * ) Notice: Subject to any disclaimer, the term of this patent is extended or adjusted under 35 U.S.C. 154(b) by 391 days.

(21) Appl. No.: 11/994,792

(22) PCT Filed: Jun. 22, 2006

(86) PCT No.: PCT/JP2006/312495
§ 371 (c)(1),
(2), (4) Date: Jan. 4, 2008

(87) PCT Pub. No.: WO2007/004432
PCT Pub. Date: Jan. 11, 2007

(65) Prior Publication Data
US 2009/0115461 A1    May 7, 2009

(30) Foreign Application Priority Data
Jul. 5, 2005   (JP) ............................. 2005-196107
Jul. 5, 2005   (JP) ............................. 2005-196108

(51) Int. Cl.
*H02M 11/00* (2006.01)
(52) U.S. Cl. .................................................. 327/103
(58) Field of Classification Search ................. 327/103
See application file for complete search history.

(56) References Cited
U.S. PATENT DOCUMENTS
5,594,383 A * 1/1997 Tamba ........................ 327/552

6,504,432 B1 * 1/2003 Rokhsaz ..................... 330/258
2003/0095006 A1 * 5/2003 Ueno et al. ................. 330/258

FOREIGN PATENT DOCUMENTS
JP     2000-148262 A     5/2000
JP     2006-148775 A     6/2006

OTHER PUBLICATIONS

Mohieldin, et al., "Nonlinear Effects in Pseudo Differential OTAs With CMFB", IEEE Transactions on Circuits and Systems-II: Analog and Digital Signal Processing, Oct. 2003, pp. 762-769, vol. 50, No. 10, IEEE.
Nauta, Bram, Analog CMOS Filters for Very High Frequencies, 1993, pp. 87-88, Kluwer Academic Publishers.
Teo, et al., "Fifth Order Low-pass Transitional Gm-C Filter with Relaxation Oscillator Frequency Tuning Circuit", 2003, pp. 229-232, IEEE.

* cited by examiner

*Primary Examiner*—Lincoln Donovan
*Assistant Examiner*—William Hernandez
(74) *Attorney, Agent, or Firm*—Sughrue Mion, PLLC

(57) ABSTRACT

The present invention is intended to achieve a transconductance amplifier and a voltage/current converting method which can provide a sufficient amplitude and a high degree of design freedom. The method comprises the steps of converting a first voltage signal to a first current signal; converting a second voltage signal to a second current signal; obtaining the common-mode components of the first and second current signals; and subtracting the common-mode components from the first and second current signals to obtain third and fourth signals, and further, subtracting the fourth current signal from the third current signal to generate a first output, while subtracting the third current signal from the fourth current signal to generate a second output.

15 Claims, 30 Drawing Sheets

TOTAL DIFFERENTIAL INPUT STAGE TYPE

PSEUDO-DIFFERENTIAL INPUT TYPE $$I_D = \frac{1}{2}\mu C_{ox}\left(\frac{W}{L}\right)(V_{GS}-V_T)^2$$

$$I_1 = k(V_a-V_T)^2$$

$$I_2 = k(V_b-V_T)^2$$

$$V_c = V_a + V_b$$

$$I_1 - I_2 = k(V_c - 2V_T)(V_a - V_b)$$

$$\Delta I = Gm(V_a - V_b)$$

CONTROL Gm USED BY BIAS VOLTAGE

CURRENT CONVERTING METHOD, TRANSCONDUCTANCE AMPLIFIER AND FILTER CIRCUIT USING THE SAME

TECHNICAL FIELD

The present invention relates to a transconductance amplifier and a voltage-to-current converting method which are effective in RF low-pass filter circuits.

BACKGROUND ART

In recent years, RF systems have been used as means for communicating information between devices in portable electronic devices, electric home appliances, peripheral devices for personal computers, and the like. Wireless systems used in these electronic devices are fabricated in semiconductor integrated circuits to reduce size and weight and to lower price. Generally, an RF system requires a filter which has an abrupt cut-off frequency in order to separate a particular frequency component. However, since elements used in semiconductor integrated circuits suffer from substantial variability in manufacturing, it has been difficult to accomplish a filter circuit which has an abrupt cut-off frequency. Accordingly, a Gm-C filter composed of a transconductance amplifier [hereinafter called "OTA" (Operational Transconductance Amplifier) and a capacitance has been used.]

FIG. 1 is a diagram showing the basic configuration of a transconductance amplifier (hereinafter called "OTA" (Operational Transconductance Amplifier).

As illustrated, the OTA is an element for generating currents $G_m V_{in}/2$, $-G_m V_{in}/2$ which are proportional to input voltage $V_{in}$, and ideally has infinite input impedance and output impedance.

In this event, proportion coefficient $G_m$ is a parameter called mutual conductance, and an OTA applied to a filter and the like is configured to have the ability to control the mutual conductance with a signal from the outside.

FIG. 2 is a circuit diagram showing a specific configuration of an OTA which is controlled mutual conductance $G_m$, for example, a degenerated differential OTA presented in Bran Nauta, "Analog CMOS Filters for Very High Frequencies", Kluwer Academic Publishers, 1993, pp. 87-88.

Current sources 404, 405, 406, 407 each apply the same current value. Also, a resistive component of variable resistive element 403 connected to sources of input transistors 401, 402 varies in resistance in response to mutual conductance control signal 408 applied from the outside.

When input transistors 401, 402 have large transconductance, a current of $\Delta V/R/2$ appears at the output, where R represents a resistive component of variable resistive element 403. Here, $\Delta V$ represents a voltage of a differential component of a voltage signal applied to the input. Therefore, arbitrary mutual conductance $G_m$ can be accomplished by controlling the resistance of variable resistive element 403 with control signal 408. This configuration of an input stage is generally called a total differential input stage.

With the miniaturization of processes in recent years, lower voltages have been required for power supplies. In particular, when a source voltage is equal to or lower than one volt, limitations are imposed on the number of vertically stacked stages of transistors which can be used between the power supply and GND, thus making it impossible to use conventional circuit configurations. In the circuit configuration shown in FIG. 2, at least one or more transistors are required in the current source, three stages of transistors are used between the power supply and GND when they are vertically stacked. A transistor generally requires a drain-source voltage of approximately 200 mV when it operates in a saturation region, so that when transistors are vertically stacked in three stages, 600 mV is required irrespective of the magnitude of the signal. Accordingly, when the source voltage is one volt, only 400 mV is available for a signal amplitude, giving rise to a problem of the inability to provide a sufficient amplitude.

FIG. 3 includes diagrams showing the configuration of a pseudo-differential input type OTA disclosed in Ahmed Nader Mohieldin, "Nonlinear Effects in Pseudo Differential OTAs with CMFB", IEEE Transactions on Circuits and Systems, Vol. 50, No. 10, October 2003, pp. 762-769, where FIG. 3a is a circuit diagram, and FIG. 3b is an equivalent circuit diagram of an output stage.

In FIG. 3a, sources of p-moss transistors $M_{2A}$, $M_{2B}$, $M_{O2A}$, $M_{O2B}$ are commonly connected to a power supply, while source of n-moss transistors $M_{1A}$, $M_{1B}$, $M_{O1A}$, $M_{O1B}$ are commonly grounded. Each drain of p-mos transistor $M_{2A}$, $M_{2B}$, $M_{O2A}$, $M_{O2B}$ is connected to each drain of n-moss transistors $M_{1A}$, $M_{1B}$, $M_{O1A}$, $M_{O1B}$, while gates of p-moss transistors $M_{2A}$, $M_{O2A}$ are connected to a drain of p-moss transistor $M_{O2A}$, and gates of p-moss transistors $M_{2B}$, $M_{O2B}$ are connected to a drain of p-mos transistor $M_{O2B}$, to form a current mirror circuit. Each gate of n-moss transistor $M_{1A}$, $M_{O1A}$ is connected in common, and each gate of n-moss transistors $M_{1B}$, $M_{O1B}$ is connected in common to define an input part of gate signals $V_a$, $V_b$. Output current Iout1 is generated from the drains of transistors $M_{1A}$, $M_{2A}$, while output current Iout2 is generated from the drains of transistors $M_{1B}$, $M_{2B}$.

In the circuit configured as described above, transistors $M_{1A}$, $M_{1B}$ are input transistors, transistors $M_{O1A}$, $M_{O1B}$ convert common-mode components of a signal from a voltage to a current, and a current proportional to the common-mode components is supplied to transistors $M_{1A}$, $M_{1B}$ by the current mirror circuit composed of transistors $M_{O2A}$, $M_{O2B}$ and transistors $M_{2A}$, $M_{2B}$.

A current flowing through a current source has a current value one half of a current value proportional to the common-mode components of the signal generated by transistors $M_{O1A}$, $M_{O1B}$.

Generally, drain current ID of a MOSFET is represented by:

$$I_D = \tfrac{1}{2}\mu C_{ox}[W/L](V_{GS}-V_T)^2$$

When the drain current of a transistor applied with a gate-source voltage $V_a$ is $I_1$, and the drain current of a transistor applied with a gate-source voltage $V_a$ is $I_2$, where the size (W/L) of each transistor is the same, $I_1$, $I_2$ can be represented in the following manner through simplification of the above equation:

$$I_1 = k(V_a - V_T)^2$$

$$I_2 = k(V_b - V_T)^2$$

Here, when $V_c = V_a + V_b$, $$I_1 - I_2 = k(V_c - 2V_T)(V_a - V_b),$$

and difference $\Delta I$ of the current is represented by:

$$\Delta I = G_m(V_a - V_b)$$

As shown in this equation, difference $\Delta I$ of currents which flow through the two types of transistors has a value proportional to the difference between gate signals $V_a$, $V_b$ applied to their gates, thus permitting the transistors to act as an OTA.

The example shown in FIG. 3 will be described. Assuming that transistors $M_{1A}$, $M_{1B}$, $M_{O1A}$, $M_{O1B}$ are equal in size to one another, and $M_{2A}$, $M_{2B}$, $M_{O2A}$, $M_{O2B}$ are equal in size to one another, drain current $I_1$ flows into transistors $M_{1A}$, $M_{01A}$ applied with signal $V_a$ between the gate and source, while drain current $I_2$ flows into transistors $M_{1B}$, $M_{01B}$ applied with signal $V_b$ between the gate and source, respectively. Since drain currents $I_1$, $I_2$ of $M_{01A}$, $M_{01B}$ are mirrored by the current mirror circuit composed of $M_{2A}$, $M_{02A}$ and $M_{2B}$, $M_{02B}$, a current of $(I_1+I_2)/2$ flows into the drains of transistors $M_{2A}$ and $M_{2B}$, respectively. Here, since the drain currents of transistors $M_{1A}$ and $M_{1B}$ are $I_1$, $I_2$, respectively, currents of $(I_1-I_2)/2$, $(I_1-I_2)/2$ are output from the output stage of FIG. 3b. Thus, since the difference between $I_1$ and $I_2$ is output in proportion to the difference between gate signals $V_a$, $V_b$, they act as an OTA. In this regard, in the exemplary OTA shown in FIG. 3, when the mutual conductance is changed from the outside, it can be controlled by controlling an common-mode bias voltage of an input signal.

FIG. 4 is a diagram showing a pseudo differential input type OTA shown in FIG. 3 in a functional block form. In FIG. 4, first voltage/current converting element 1701 and third voltage/current converting element 1703 correspond to transistors $M_{1A}$, $M_{1B}$, while second voltage/current converting element 1702 and fourth voltage/current converting element 1704, which form part of common-mode current generating part 1705, correspond to transistors $M_{01A}$, $M_{01}$. Current mirror circuit 1706, which corresponds to transistors $M_{02A}$, $M_{02B}$ and transistors $M_{2A}$, $M_{2B}$, is a circuit for inverting the polarity of an input current to output a current which is proportional to the input current.

As described above, the output impedance of the OTA is ideally infinite. As such, in the circuits shown in FIGS. 1 to 3, an output DC bias overshoots to the power supply side or to the ground side, being incapable of acquiring a signal. Accordingly, a CMFB (Common Mode Feed Back) circuit is known for setting an output DC bias (see Non-Patent Document 2).

FIG. 5 includes diagrams showing the configuration of a CMFB circuit, where FIG. 5a is a block diagram conceptually showing the configuration of the CMFB circuit, FIG. 5b is a circuit diagram showing a specific configuration, and FIG. 5c is a block diagram showing an exemplary application of the CMFB circuit.

First, the operation of the CMFB circuit will be described with reference to FIG. 5a. Common-mode bias detecting circuit 703, which forms part of CMFB circuit 702, is applied with outputs $V_{OUT}+$, $V_{OUT}-$ of OTA 701, and feeds an common-mode bias component of them back to OTA 701 as output bias control signal 704. In addition to output bias control signal 704, OTA 701 is applied with reference signal 705 as a control signal, such that OTA 701 compares output bias control signal 704 with reference signal 705 to control its output such that output bias control signal 704 provides a predetermined constant bias.

In this regard, while the CMFB circuit can refer to an common-mode bias detecting circuit provided externally to the OTA, as shown in FIG. 5a, the CMFB circuit includes circuits within the OTA for receiving the output bias control signal and reference signal for performing the comparison and feedback, in addition to the common-mode bias detecting circuit.

As shown in FIG. 5b, this conventional example comprises n-mos transistors $M_{3A}'$, $M_{3A}$, $M_{03A}$, $M_{2A}$, $M_{3B}'$, $M_{3B}$, $M_{03B}$, $M_{2B}$ and p-mos transistors $M_{04A}'$, $M_{4A}$, $M_{04A}$, $M_{1A}$, $M_{04B}'$, $M_{4B}$, $M_{04B}$, $M_{1B}$.

Respective p-mos transistors $M_{1A}$, $M_{1B}$, $M_{04A}$, $M_{04B}$, $M_{4A}$, $M_{4B}$ correspond to n-mos transistor $M_{2A}$, $M_{2B}$, $M_{03A}$, $M_{03B}$, $M_{3A}$, $M_{3B}$, and these corresponding transistors have a common drain, and are provided between the power supply and ground to form an OTA. P-mos transistors $M_{1A}$, $M_{1B}$ and n-mos transistors $M_{2A}$, $M_{2B}$ make up an input differential pair, and $V_{IN}+$, $V_{IN}-$ are supplied to the gates of p-mos transistors $M_{1A}$, $M_{1B}$. Transistors $M_{1A}$, $M_{2A}$ have their drains connected to the gates of transistors $M_{2A}$, $M_{03A}$, $M_{3A}$, while transistors $M_{1B}$, $M_{2B}$ have their drains connected to the gates of transistors $M_{2B}$, $M_{03B}$, $M_{3B}$.

Each gate of p-mos transistors $M_{1A}$, $M_{1B}$, $M_{04A}$, $M_{04B}$, $M_{4A}$, $M_{4B}$ is made common, serve as node $V_X$ (preceding stage), and is connected to the drains of transistors $M_{04A}$, $M_{04B}$. Transistors $M_{3A}$, $M_{3B}$, $M_{4A}$, $M_{4B}$ make up an output stage of the OTA, where the drains of transistors $M_{3A}$, $M_{3B}$ are used for an output node of $V_{OUT}+$, while the drains of transistors $M_{4A}$, $M_{4B}$ are used for an output node of $V_{OUT}-$.

Transistors $M_{3A}'$, $M_{3B}'$, $M_{4A}'$, $M_{4B}'$ form part of the CMFB circuit, where transistor $M_{3A}'$ which is supplied with reference signal $V_Y$ at a gate has a source grounded, and has a drain connected to the drains of transistors $M_{3A}$, $M_{4A}$. Transistor $M_{3B}'$ which is applied with reference signal $V_Y$ at a gate has a source grounded, and has a drain connected to the drains of transistors $M_{3B}$, $M_{4B}$. Transistor $M_{4A}'$, the gate of which serves as node $V_X$ (next stage), has a source connected to a power supply, and a drain connected to drains of transistors $M_{3A}$, $M_{4A}$. Transistor $M_{4B}'$, whose gate serves as node $V_X$ (next stage), has a source connected to the power supply, and a drain connected to drains of transistors $M_{3B}$, $M_{4B}$.

In FIG. 5b, a circuit made up of transistors $M_{1A}$, $M_{1B}$, $M_{2A}$, $M_{2B}$ is a circuit at an input stage for generating $V_a$, $V_b$ at the gates of transistors $M_{2A}$, $M_{2B}$, and is a circuit corresponding to a circuit for generating $V_a$, $V_b$ in the circuit diagram shown in FIG. 3a. Other parts corresponding to the circuit diagram of FIG. 3a are as follows.

Transistors $M_{03A}$, $M_{03B}$, $M_{04A}$, $M_{04B}$ in FIG. 5b correspond to transistors $M_{01}$, $M_{02}$ in FIG. 3a, and transistors $M_{3A}$, $M_{3B}$, $M_{4A}$, $M_{4B}$ correspond to transistors $M_1$, $M_2$ in FIG. 3a. Also, among the transistors shown in FIG. 5b, transistors $M_{3A}'$, $M_{3B}'$, $M_{4A}'$, $M_{4B}'$ which have no corresponding transistors in FIG. 3a form part of the CMFB circuit.

Next, the operation of the circuit shown in FIG. 5b will be described.

The operation of the OTA part in this conventional example is similar to the operation described with reference to FIG. 3a. As $V_{IN}+$, $V_{IN}-$ are applied to input transistor pair $M_{1A}$, $M_{1B}$, $V_a$, $V_b$ are generated at the gates of transistors $M_{03A}$, $M_{03B}$, and are converted from voltage to current to remove a differential component at node $V_X$ (preceding stage). When OTAs are connected in series at two or more stages, for example, OTA1 and OTA2 are connected in series at two stages as shown in FIG. 5c, $V_X$ (preceding stage) of OTA2 is connected to node $V_X$ (next stage) of OTA1 which is provided at the preceding stage. In this conventional example, an common-mode bias component of the output signal of OTA1 appears at node $V_X$ (preceding stage) of OTA2. By returning this common-mode bias component to node $V_X$ (next stage) of OTA1, a negative feedback is applied to an output common-mode bias of OTA1. Also, in this event, by supplying reference signal $V_Y$ to the gates of transistors $M_{3A}'$, $M_{3B}'$, the common-mode biases of outputs $V_{OUT}+$, $V_{OUT}-$ are set at predetermined biases.

Non-Patent Document 1: Bran Nauta, "Analog CMOS Filters for Very High Frequencies", Kluwer Academic Publishers, 1993, pp. 87-88

Non-Patent Document 2: Ahmed Nader Mohieldin, "Nonlinear Effects in Pseudo Differential OTAs with CMFB", IEEE Transactions on Circuits and Systems, Vol. 50, No. 10, October 2003, pp. 762-769

DISCLOSURE OF THE INVENTION

Problems to be Solved by the Invention

In the related art shown in FIG. 2, even if the common-mode bias component of an input signal changes, the common-mode component of a current flowing through a transistor is constant with the aid of a current source connected to the source of the input transistor, but there is a problem that a sufficient amplitude cannot be provided because a high source voltage is required.

In the related art shown in FIG. 3, the operation can be performed at a low source voltage, but since there is no current source at the source of a transistor which is at the input stage, the common-mode component of a current flowing through the transistor changes depending on the common-mode component of the input signal. For this reason, there is a problem that its changing amount appears at the output of the OTA as an common-mode signal. When the common-mode component of the signal appears at the output, fluctuations in the operating point of the signal can cause a reduced signal dynamic range, an error in a differential signal, and even oscillations in the worst case, so that it is deemed as desirable that the gain be at least one tenth or less. While a general OTA-based circuit is designed to remove common-mode components of signals as much as possible, in the related art shown in FIG. 3, it is, however, difficult to sufficiently remove the common-mode component.

In the OTA which is provided with a CMFB circuit for setting a DC bias of the output, shown in FIG. 5, the drains of transistors $M_{3A}$, $M_{3B}$, $M_{4A}$, $M_{4B}$, which serve as the output node of the OTA, are provided with transistors $M_{4A}'$, $M_{4B}'$ which supply a signal indicative of an common-mode bias component from the OTA provided at the next stage when connected in series, and are provided with transistors $M_{3A}'$, $M_{3B}'$ which supply a reference signal. Thus, four transistors are connected to the output node, resulting in a parallel connection of the output conductance and parasitic capacitance of each transistor. This leads to a problem that the output impedance of the OTA is reduced such that it degrades the characteristics as the OTA.

The present invention has been made in view of the problems inherent to the related art as described above, and has an object to accomplish a transconductance amplifier and a voltage-to-current converting method which are capable of reducing the common-mode component of a signal appearing at an output to provide a sufficient amplitude.

Also, the present invention has been made in view of the problems inherent to the related art as described above, and has an object to accomplish an OTA which comprises a CMFB circuit and is prevented from degrading the characteristics as an OTA.

Means for Solving the Problems

A voltage-to-current converting method of the present invention is a voltage-to-current converting method for generating a first current and a second current proportional to the difference between an input first voltage signal and second voltage signal, characterized by comprising the steps of:

converting the first voltage signal to a first current signal;

converting the second voltage signal to a second current signal;

generating an common-mode component of the first current signal and the second current signal;

generating a third current signal and a fourth current signal by subtracting the common-mode component from the first current signal and the second current signal, respectively, generating a first output by subtracting the fourth current signal from the third current signal, and generating a second output by subtracting the third current signal from the fourth current signal.

A transconductance amplifier of the present invention is characterized by comprising:

a first and a second voltage/current converting element for converting a first voltage signal to a current signal;

a third and a fourth voltage/current converting element for converting a second voltage signal to a current signal;

an common-mode current generating part for converting each of the first voltage signal and the second voltage signal to a current signal, and further generating an common-mode current in accordance with an common-mode component of each current signal;

a first current circuit for subtracting the common-mode component by the common-mode component generating part from each current signal converted by each of the first to fourth voltage/current converting elements;

a second current circuit for supplying the difference between a current signal by the first voltage/current converting element from which the common-mode component is subtracted by the first current circuit and a current signal by the third voltage/current converting element as a first current output; and a third current circuit for supplying the difference between a current signal by the fourth voltage/current converting element from which the common-mode component is subtracted by the first current circuit and a current signal by the second voltage/current converting element as a second current output.

In this event, the common-mode current generating part may comprise a fifth voltage/current converting element and a sixth voltage/current converting element for converting the first voltage signal and the second voltage signal to current signals, respectively.

Further, the first to sixth voltage/current converting elements may comprise a first to a sixth first conductivity type transistor supplied with the first voltage signal or the second voltage signal at bases or gates, the first current circuit may comprise a plurality of second conductivity type transistors, the plurality of second conductivity type transistors may have their gates in common, and at least one of the plurality of second conductivity type transistors may have a gate short-circuited to a drain, and an output of the second conductivity type transistor may be connected to any of the outputs of the first to sixth voltage/current converting elements.

Also, the first current circuit may comprise a first to a sixth second conductivity type transistor provided between a power supply and a ground together with the first to sixth voltage/current converting elements, the second conductivity type transistors may have their gates and sources in common, and at least one of the second conductivity type transistors has a gate short-circuited to a drain, and outputs of the second conductivity type transistor may be connected to outputs of the first to sixth voltage/current converting elements, respectively.

Also, the fifth first conductivity type transistor and the sixth first conductivity type transistor may be first transistors which have the same size with each other, the first to fourth first conductivity type transistors may be second transistors which have the same size with one another, the fifth second conductivity type transistor and the sixth second conductivity type transistor may be third transistors which have the same size with each other, the first to fourth second conductivity type transistors may be fourth transistors which have the same size with one another, and the ratio of the size of the first transistor to the size of the second transistor may be equal to the ratio of the size of the third transistor to the size of the fourth transistor.

Also, the first first conductivity type transistor may form part of a first current output supplying part, and the fourth first conductivity type transistor forms part of a second current output supplying part, the second current circuit may comprise a seventh first conductivity type transistor having an output in common with an output of the first first conductivity type transistor, and an eighth first conductivity type transistor having an output and a gate in common with an output of the third first conductivity type transistor and a gate of the seventh first conductivity type transistor, the third current circuit may comprise a ninth first conductivity type transistor having an output in common with an output of the second first conductivity type transistor, and a tenth first conductivity type transistor having an output and a gate in common with an output of the fourth first conductivity type transistor and a gate of the ninth first conductivity type transistor, the second, third, fifth, and sixth first conductivity type transistors may be first transistors which have the same size with one another, the first first conductivity type transistor and the fourth first conductivity type transistor may be second transistors which have the same size with each other, the eighth first conductivity type transistor and the tenth first conductivity type transistor may be third transistors which have the same size with each other, the seventh first conductivity type transistor and the ninth first conductivity type transistor may be fourth transistors which have the same size with each other, the fifth second conductivity type transistor, the sixth second conductivity type transistor, the second second conductivity type transistor, and the third second conductivity type transistor may be fifth transistors which have the same size with one another, the first second conductivity type transistor and the fourth second conductivity type transistor may be sixth transistors which match in size with each other, and the ratio of the size of the first transistor to the size of the second transistor, the ratio of the size of the third transistor to the size of the fourth transistor, and the ratio of the size of the fifth transistor to the size of the sixth transistor may be equal.

Also, a transconductance amplifier may comprise a plurality of transconductance amplifiers described in any of the foregoing, a fourth current circuit provided in one transconductance amplifier for generating a difference between a first current output and a second current output in the one transconductance amplifier as a first current output; and a fifth current circuit provided in another transconductance amplifier for generating a difference between a second current output and a first current output in the other transconductance amplifier as a second current output.

Further, the common-mode current generating part may comprise a seventh voltage/current converting element supplied with a third voltage signal at a base or a gate, and generate an common-mode current including a bias current in accordance with the third voltage signal as the common-mode current.

Also, the transconductance amplifier may comprise a first bias current generating element for generating a first bias current added to a reference current supplied by the first current circuit to the second current circuit; and a second bias current generating element for generating a second bias current added to a reference current supplied by the first current circuit to the third current circuit.

A filter circuit of the present invention is a first-order filter circuit configured using the transconductance amplifiers described above, wherein:

the filter circuit comprises the transconductance amplifier and a capacitance, and is made up of a first and a second transconductance amplifier, the first transconductance amplifier having an output terminal and an inverting output terminal connected to an input terminal and an inverting input terminal of the second transconductance amplifier, respectively, and grounded through capacitances, the second transconductance amplifier having an output terminal and an inverting output terminal connected to the inverting input terminal and an input terminal of the second transconductance amplifier.

A filter circuit according to another aspect of the present invention is a fourth-order filter circuit configured using the transconductance amplifiers described above, wherein:

the filter circuit comprises a first to a fourth transconductance amplifier, the first transconductance amplifier having an output terminal and an inverting output terminal connected to an input terminal and an inverting input terminal of the second transconductance amplifier and grounded through capacitances, the second transconductance amplifier having an output terminal and an inverting output terminal connected to the input terminal and an inverting input terminal of the second transconductance amplifier and grounded through capacitances, the third transconductance amplifier having an output terminal and an inverting output terminal connected to an inverting input terminal and an input terminal of the third transconductance amplifier, the fourth transconductance amplifier having an input terminal and an inverting input terminal connected to the output terminal and inverting output terminal of the second transconductance amplifier, the fourth transconductance amplifier having an output terminal and an inverting output terminal connected to the inverting input terminal and input terminal of the second transconductance amplifier.

A filter circuit according to a further aspect of the present invention comprises one first-order filter circuit described above connected in series with two fourth-order filter circuits described above.

A voltage generating circuit according to the present invention is a voltage generating circuit configured using the transconductance amplifier described above, characterized in that:

the transconductance amplifier has an output terminal and an inverting output terminal connected to an inverting input terminal and an input terminal, and the voltage generating circuit comprises a capacitance for alternatingly grounding one output part of the transconductance amplifier.

A voltage generating circuit according to another aspect of the present invention is a voltage generating circuit configured using the transconductance amplifier described above, characterized in that:

the voltage generating circuit comprises a first and a second transconductance amplifier and a capacitance, the first transconductance amplifier having an output terminal and an inverting output terminal connected to an input terminal and an inverting input terminal of the second transconductance amplifier and connected to an inverting input terminal and an input terminal of the first transconductance amplifier, the input terminal and inverting input terminal of the first transconductance amplifier connected to an input through capacitances, respectively, an output terminal and an inverting output terminal of the second transconductance amplifier respectively serving as outputs.

A current controlled oscillator of the present invention is a current controlled oscillator configured using the voltage generating circuit described above, which comprises:

a plurality of resistors provided in series between a power supply and a ground;

a switch group provided between the plurality of resistors and an input of the voltage generating circuit for selectively applying a voltage divided by the plurality of resistors to the voltage generating circuit;

a first and a second comparator for comparing terminal voltages of the plurality of resistors provided in series with an output of the voltage generating circuit; and a flip-flop whose state changes in accordance with outputs of the first and second comparators and which generates an output which defines an oscillation frequency and is used as a switching control signal for the switch group.

A PLL circuit of the present invention is a PLL circuit configured using the current controlled oscillator described above, which comprises:

a current controlled oscillator, whose oscillation frequency is controlled by a current control signal;

a phase detector for receiving a reference frequency signal and an output of the current controlled oscillator to generate a signal in accordance with a phase difference therebetween; and a voltage/current converter for converting an output of the phase detector to a current, and supplying the same to the control signal input terminal of the current controlled oscillator.

In the present invention configured as described above, the common-mode current generating circuit generates a current of an common-mode component alone. This current of the common-mode component is distributed by the first current mirror circuit, and is subtracted from the output of each voltage/current converting element, thereby leaving only the current of a differential component at each output. In this event, while the error component of an amount depending on the common-mode component generated by the first current mirror circuit is added to each output, these error components are removed by the second current mirror circuit and third current mirror circuit.

A transconductance amplifier according to another aspect of the present invention is a transconductance amplifier for generating a first output voltage signal and a second output voltage signal proportional to the difference between a first input voltage signal and a second input voltage signal applied thereto from a first and a second output stage, respectively. The transconductance amplifier is characterized by comprising:

a feedback signal output terminal for outputting common-mode components of the first output voltage signal and second output voltage signal;

a feedback signal input terminal; and a reference signal input terminal, provided in the first and second output stages, respectively; and feedback signal conveying means for controlling the first output voltage signal or second output voltage signal in accordance with an input signal to the feedback signal input terminal and an input signal to the reference signal input terminal, wherein the feedback signal conveying means is connected to each output stage.

In this event, the feedback signal conveying means may comprise:

a current mirror circuit having an output part connected to the output stage;

a first transistor of a first conductivity type having a control terminal connected to the feedback signal input terminal; and a second transistor of a second conductivity type having a control terminal connected to the reference signal input terminal for determining a reference current for the current mirror circuit together with the first transistor.

A transconductance amplifier according to a second aspect of the present invention is a transconductance amplifier for generating a first output voltage signal and a second output voltage signal proportional to the difference between a first input voltage signal and a second input voltage signal applied thereto from a first and a second output stage, respectively. The transconductance amplifier is characterized by comprising:

a feedback signal output terminal for outputting common-mode components of the first output voltage signal and second output voltage signal;

a reference signal input terminal for receiving a reference signal for bringing each of the first and second output stages into a predetermined bias state;

a feedback signal input terminal; and feedback signal communicating means for controlling the first output voltage signal or the second output voltage signal in accordance with an input signal to the feedback signal input terminal and an input signal to the reference signal input terminal, provided in the first and second output stages, respectively; and feedback signal conveying means for controlling the first output voltage signal or second output voltage signal in accordance with an input signal to the feedback signal input terminal and an input signal to the reference signal input terminal, wherein the feedback signal conveying means is connected to each output stage.

In this event, the feedback signal conveying means may comprise:

a current mirror circuit having an output part connected to the output stage;

a first transistor of a first conductivity type having a control terminal connected to the feedback signal input terminal; and a second transistor of a second conductivity type for receiving the first input voltage signal or the first input voltage signal at a control terminal to determine a reference current for the current mirror circuit together with the first transistor.

Also, the feedback signal conveying means may be a transistor which has a control terminal connected to the feedback signal input terminal and an output part connected to the output stage.

A filter circuit of the present invention is a first-order filter circuit configured using the transconductance amplifier described above, wherein:

the filter circuit comprises the transconductance amplifier and a capacitance, and is made up of a first and a second transconductance amplifier, the first transconductance amplifier having an output terminal and an inverting output terminal connected to an input terminal and an inverting input terminal of the second transconductance amplifier, respectively, and grounded through capacitances, the second transconductance amplifier having an output terminal and an inverting output terminal connected to the inverting input terminal and input terminal of the second transconductance amplifier.

A filter circuit according to another aspect of the present invention is a fourth-order filter circuit configured using the transconductance amplifiers described above, wherein:

the filter circuit comprises a first to a fourth transconductance amplifier, the first transconductance amplifier having an output terminal and an inverting output terminal connected to an input terminal and an inverting input terminal of the second transconductance amplifier and grounded through capacitances, the second transconductance amplifier having an output terminal and an inverting output terminal connected to the input terminal and inverting input terminal of the second transconductance amplifier and grounded through capacitances, the third transconductance amplifier having an output terminal and an inverting output terminal connected to an inverting input terminal and an input terminal of the third transconductance amplifier, the fourth transconductance amplifier having an input terminal and an inverting input terminal connected to the output terminal and inverting output terminal of the second transconductance amplifier, the fourth transconductance amplifier having an output terminal and an inverting output terminal connected to the inverting input terminal and input terminal of the second transconductance amplifier.

A filter circuit according to a further aspect of the present invention comprises one first-order filter circuit described above connected in series with two fourth-order filter circuits described above.

A voltage generating circuit of the present invention is a voltage generating circuit configured using the transconductance amplifier described in any of the foregoing, characterized in that:

a feedback signal input terminal is used as a control signal input terminal for generating a bias current to change mutual conductance, and the voltage generating circuit comprises a capacitance for alternatingly grounding an output current.

A current controlled oscillator of the present invention is a current controlled oscillator configured using the voltage generating circuit described above, comprising:

a plurality of resistors provided in series between a power supply and a ground;

a switch group provided between the plurality of resistors and an input of the voltage generating circuit for selectively applying a voltage divided by the plurality of resistors to the voltage generating circuit;

a first and a second comparator for comparing terminal voltages of the plurality of resistors provided in series with an output of the voltage generating circuit; and a flip-flop whose state changes in accordance with outputs of the first and second comparators and which generates an output which defines an oscillation frequency and is used as a switching control signal for the switch group.

A PLL circuit of the present invention is a PLL circuit configured using the current controlled oscillator described above, comprising:

a current controlled oscillator, whose oscillation frequency is controlled by a current control signal;

a phase detector for receiving a reference frequency signal and an output of the current controlled oscillator to generate a signal in accordance with a phase difference therebetween; and a voltage/current converter for converting an output of the phase detector to a current, and supplying the same to the control signal input terminal of the current controlled oscillator.

EFFECTS OF THE INVENTION

In the present invention, since the gain of the common-mode component is reduced in the output, it is possible to effectively provide a sufficient amplitude and to increase the degree of freedom of design.

Also, in the present invention configured as described above, the output stage is connected only to the feedback signal conveying means, more specifically, to the output part of the current mirror circuit or transistor, so that only one transistor is connected other than the transistor which forms part of the output stage of the transconductance amplifier. Accordingly, a smaller number of transistors is connected than before, making it possible to accomplish an OTA which comprises a CMFB circuit that restrains degradations in characteristics.

BRIEF DESCRIPTION OF THE DRAWINGS

[FIG. 29b]
A circuit diagram showing the configuration of first-order filter 241 in FIG. 29a.

[FIG. 29c]
A circuit diagram showing the configuration of fourth-order filters 242, 243 in FIG. 29a.

[FIG. 30b]
A circuit diagram showing the configuration of current controlled oscillator 255 in FIG. 30a.

[FIG. 34b]
A circuit diagram showing the configuration of first-order filter 241 in FIG. 34a.

[FIG. 34c]
A circuit diagram showing the configuration of fourth-order filters 242, 243 in FIG. 34a.

[FIG. 35b]
A circuit diagram showing the configuration of current controlled oscillator 255 in FIG. 35a.

DESCRIPTION OF REFERENCE NUMERALS

101 First Voltage/Current Converting Element
102 Second Voltage/Current Converting Element
103 Third Voltage/Current Converting Element
104 Fourth Voltage/Current Converting Element
105 Fifth Voltage/Current Converting Element
106 Sixth Voltage/Current Converting Element
107 In-Phase Current Generating Part
108 First Current Mirror Circuit
109 Second Current Mirror Circuit
110 Third Current Mirror Circuit
$M_{03A}$, $M_{3A}$, $M_{5A}$, $M_{6A}$, $M_{7A}$, $M_{03B}$, $M_{3B}$, $M_{5B}$, $M_{6B}$, $M_{7B}$ n-mos Transistors
$M_{04A}$, $M_{4A}$, $M_{8A}$, $M_{04}$, $M_{4B}$, $M_{8B}$ p-mos Transistors

BEST MODE FOR CARRYING OUT THE INVENTION

Next, embodiments of the present invention will be described with reference to the drawings.

First Embodiment

Figure 6:
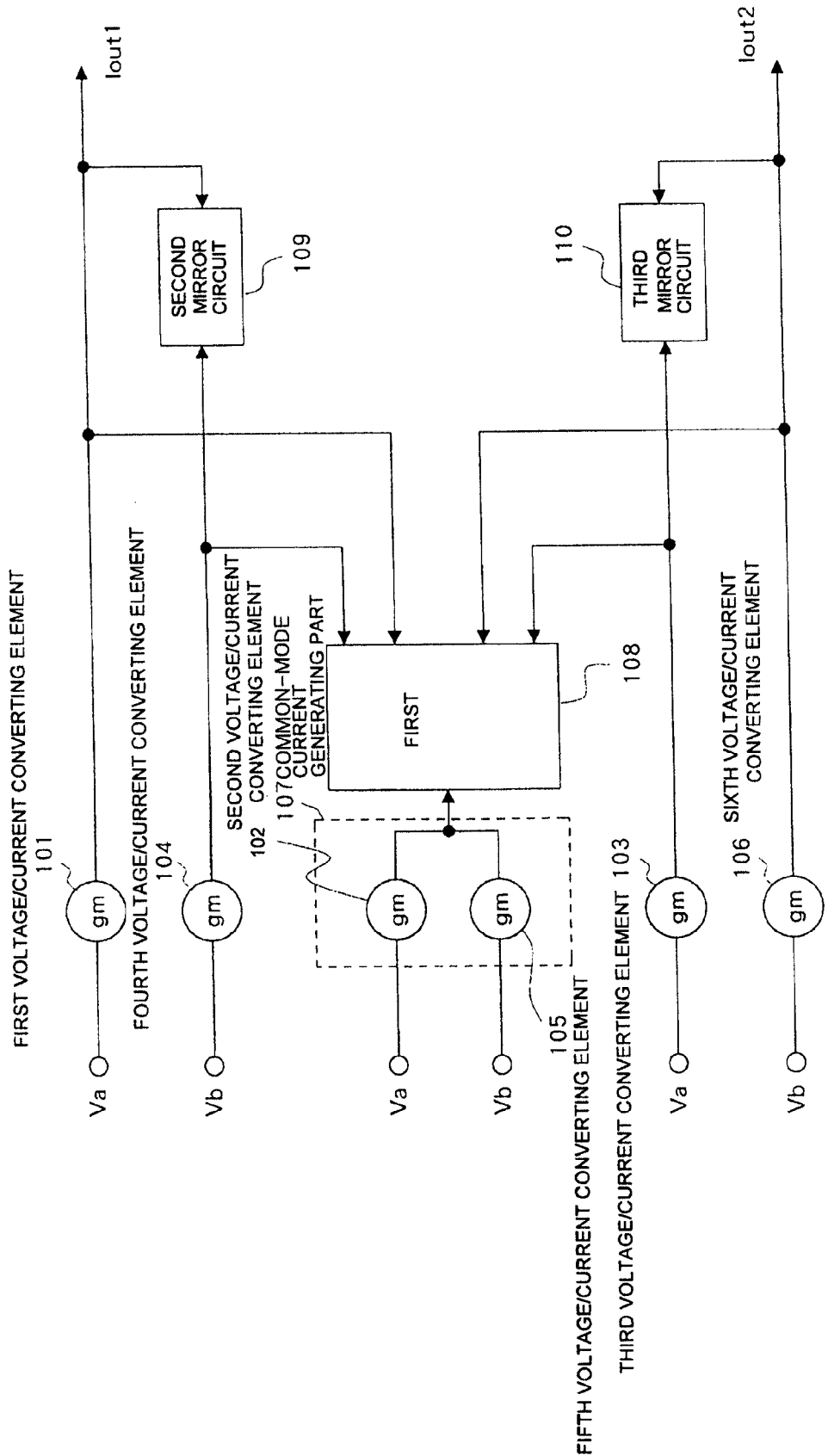
[FIG. 6]
An equivalent circuit diagram showing the configuration of a first embodiment according to the present invention.
Figure 7:
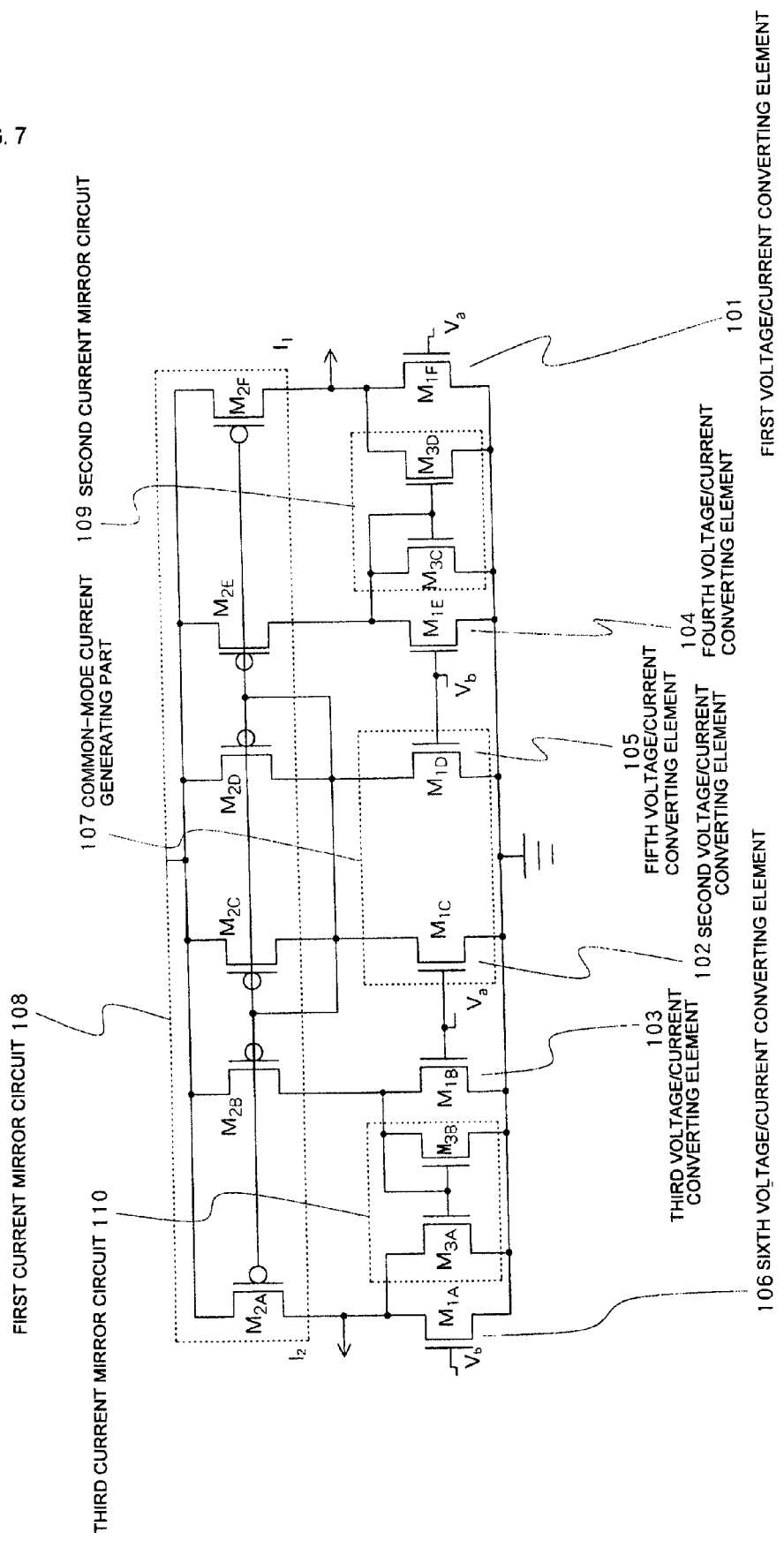
[FIG. 7]
A circuit diagram showing the configuration of the first embodiment according to the present invention.

FIGS. 6 and 7 are diagrams showing the configuration of a first embodiment according to the present invention, where FIG. 6 is an equivalent circuit diagram, and FIG. 7 is a circuit diagram.

As shown in the equivalent circuit of FIG. 6, this embodiment comprises first to sixth voltage/current converting elements 101-106, common-mode current generating part 107, first to third current mirror circuits 108-110.

Replacing the configuration of FIG. 6 with a specific circuit shown in FIG. 7, first to sixth voltage/current converting elements 101-106 are made up of n-mos transistors $M_{1F}$, $M_{1C}$, $M_{1B}$, $M_{1E}$, $M_{1D}$, $M_{1A}$. The first current mirror circuit is made up of p-mos transistors $M_{2A}$-$M_{2F}$. The second current mirror circuit is made up of n-mos transistors $M_{3C}$, $M_{3D}$, while the third current mirror circuit is made up of n-mos transistors $M_{3A}$, $M_{3B}$. Also, common-mode current generating part 107 is made up of second voltage/current converting element 102 ($M_{1C}$) and fifth voltage/current converting element 105 ($M_{1D}$).

With regard to the size of the transistors, in the first embodiment, transistors $M_{1A}$-$M_{1F}$ are identical in size to one another, but transistors $M_{2A}$-$M_{2F}$ may differ in size from transistors $M_{1A}$-$M_{1F}$. Also, transistors $M_{3A}$, $M_{3B}$ may differ in size. In this regard, the size of each of transistors $M_{1A}$-$M_{1F}$ may be changed to a different size depending on a particular usage as in the exemplary modifications shown below.

Sources and gates of p-mos transistors $M_{2A}$-$M_{2F}$ are made common, and the sources are connected to a power supply. Each drain of p-mos transistors $M_{2A}$-$M_{2F}$ is connected to each drain of n-mos transistors $M_{1F}$, $M_{1C}$, $M_{1A}$, $M_{1B}$, $M_{1E}$, $M_{1A}$. Sources of n-mos transistors $M_{1A}$-$M_{1F}$, $M_{3A}$-$M_{3D}$ are grounded. N-mos transistors $M_{3C}$, $M_{3D}$ which form part of second current mirror circuit have their drains connected to the drains of p-mos transistors $M_{2E}$, $M_{2F}$, and have their gates connected commonly to the drain of n-mos transistor $M_{3C}$. N-mos transistors $M_{3A}$, $M_{3B}$ which form part of the third current mirror circuit have their drains connected to the drains of p-mos transistors $M_{2A}$, $M_{2B}$, and have their gates connected in common to the drain of n-mos transistor $M_{3B}$. N-mos transistors $M_{1C}$, $M_{1D}$ which form part of common-mode current generating part 107 have their respective gates connected to respective gates of n-mos transistors $M_{1B}$, $M_{1E}$, respectively, and have their drains connected commonly to each gate of p-mos transistors $M_{2A}$-$M_{2F}$.

In this regard, transistors have their drain, gate, and source connected, respectively, for example, p-mos transistors $M_{2C}$ and $M_{2D}$ can be separately provided as shown in FIG. 7, these transistors may be integrated into one by increasing the size twice. When p-mos transistors $M_{2C}$ and $M_{2D}$ are integrated into one, the first current mirror circuit is made up of five p-mos transistors.

In the circuit configured as described above, signal voltages $V_a$ and $V_b$ are converted to currents by the first to sixth voltage/current converting elements. Common-mode current generating circuit 107 generates a current proportional to an common-mode component of an input signal. The first current mirror circuit inverts the characteristic of this current proportional to the common-mode component, and subtracts the same from outputs of the first, third, fourth, and sixth voltage/current converting elements. Among the subtracted signals, the polarity of one is inverted by the second and third current mirror circuits such that the one signal is subtracted from the other to generate outputs $I_{OUT1}$, $I_{OUT2}$.

In this embodiment, signals converted from voltage to current corresponding to signal voltages $V_a$ and $V_b$ include a current of an common-mode component and a current of a differential component added thereto. In the common-mode current generating circuit, the outputs of the second and fifth voltage/current converting elements are short-circuited, so that the current of the differential component is removed, with the current of the common-mode component alone being output. This current of the common-mode component is distributed by the first current mirror circuit, and subtracted from outputs of the first, fourth, third, and sixth voltage/current converting elements, thereby causing each output to comprise the current of the differential component alone. However, generally, a circuit made up of transistors has transistors with limited output conductance, and thus the error component of an amount depending on the common-mode component is added to the output of the first current mirror circuit in this embodiment in addition to the current of the common-mode component. Consequently, the error component of the same amount is added to all of the outputs of the first, fourth, third, and sixth voltage/current converting elements. In this embodiment, the error components included in the outputs of the first and fourth voltage/current converting elements are removed by the second current mirror circuit, while the error components included in the outputs of the third and sixth voltage/current converting elements are removed by the third current mirror circuit. These outputs free from the error components are labeled output $I_{OUT1}$, output $I_{OUT2}$, respectively. Accordingly, in this embodiment, the error components attributable to the common-mode components can be reduced to provide sufficient amplitude.

The foregoing effect will be described by calculating the gain of the common-mode component.

Figure 8:
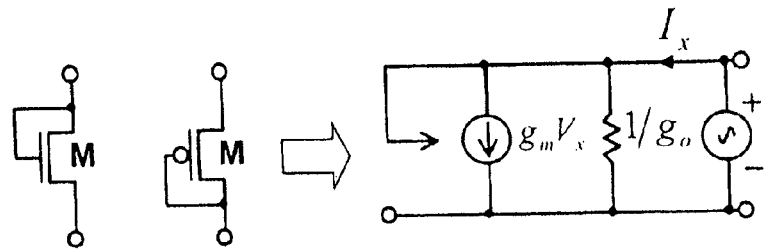
[FIG. 8]
A diagram for describing effects of the first embodiment according to the present invention.

First, a diode model is analyzed. FIG. 8 shows equivalent circuits of an n-mos transistor and a P-mos transistor, where the relationship of the current is represented by the following Equation (1):

[Equation 1]

$$-g_o v_x - g_m v_x + I_x = 0 \quad (1)$$
$$Z_M = \frac{V_x}{I_x} = \frac{1}{g_m + g_o}$$

where $g_m$, $g_o$ are mutual conductance and output conductance of the transistor, respectively. In the following, the mutual conductance and output conductance of a transistor are labeled $g_m$, $g_o$ with a suffix added thereto, unless otherwise noted.

Figure 9:
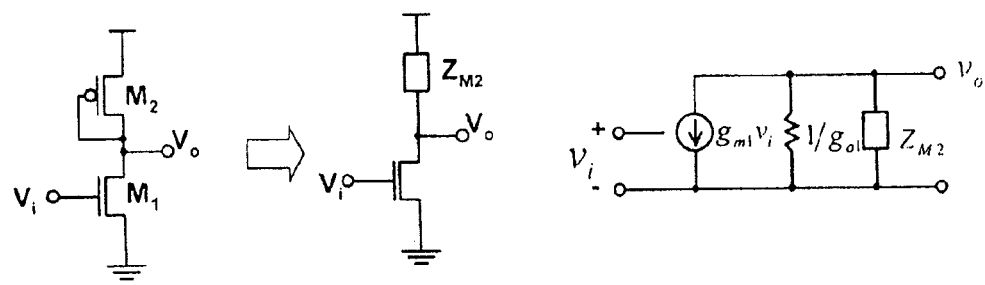
[FIG. 9]
A diagram for describing effects of the first embodiment according to the present invention.

FIG. 9 is an equivalent circuit of a source-grounded circuit with a diode added thereto, where the relationship between input voltage $v_i$ and output voltage $v_o$ is represented by the following Equation (2):

[Equation 2]

$$g_{m1} v_i + g_{o1} v_o + (g_{m2} + g_{o2}) v_o = 0 \quad (2)$$
$$\frac{v_o}{v_i} = -\frac{g_{m1}}{(g_{o1} + g_{o2} + g_{m2})}$$

Figure 3A:
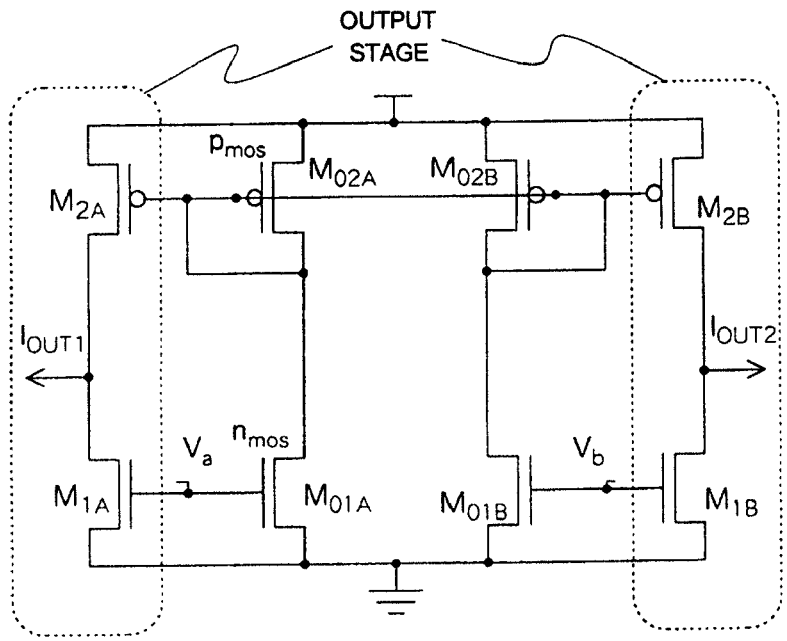
[FIG. 3a]
A circuit diagram showing the configuration of a pseudo differential input type OTA.
Figure 3B:
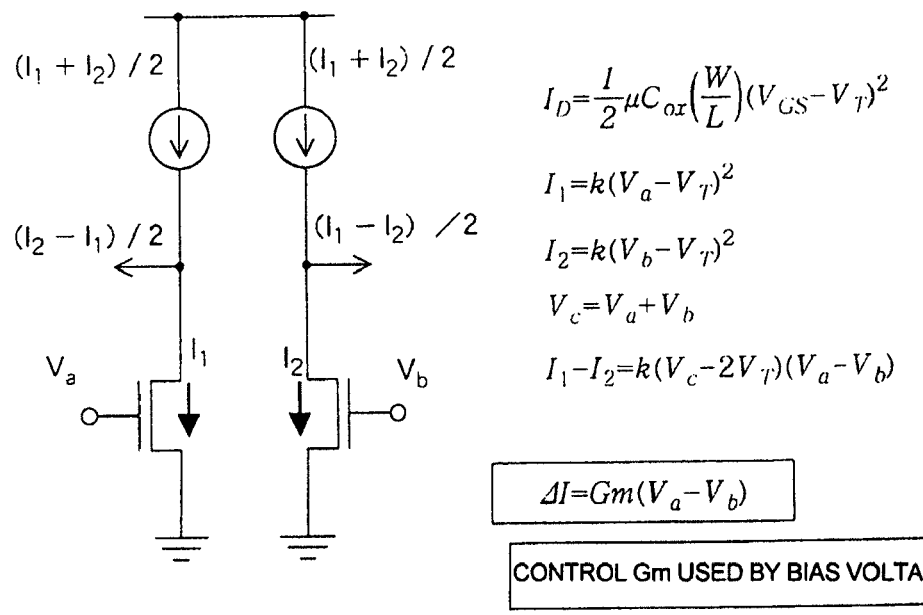
[FIG. 3b]
An equivalent circuit diagram showing the configuration of an output stage of the pseudo differential input type OTA.
Figure 4:
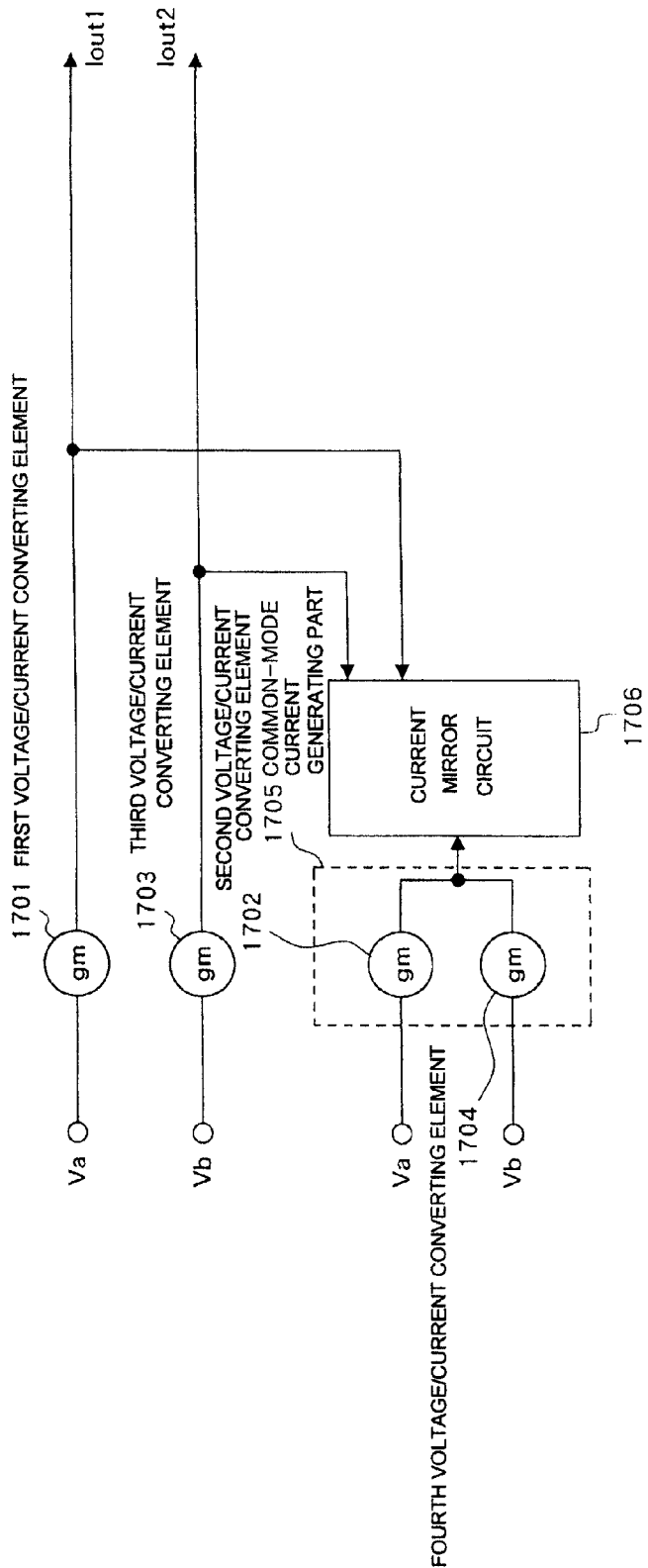
[FIG. 4]
A diagram showing the pseudo differential input type OTA shown in FIG. 3 in a functional block form.
Figure 5A:
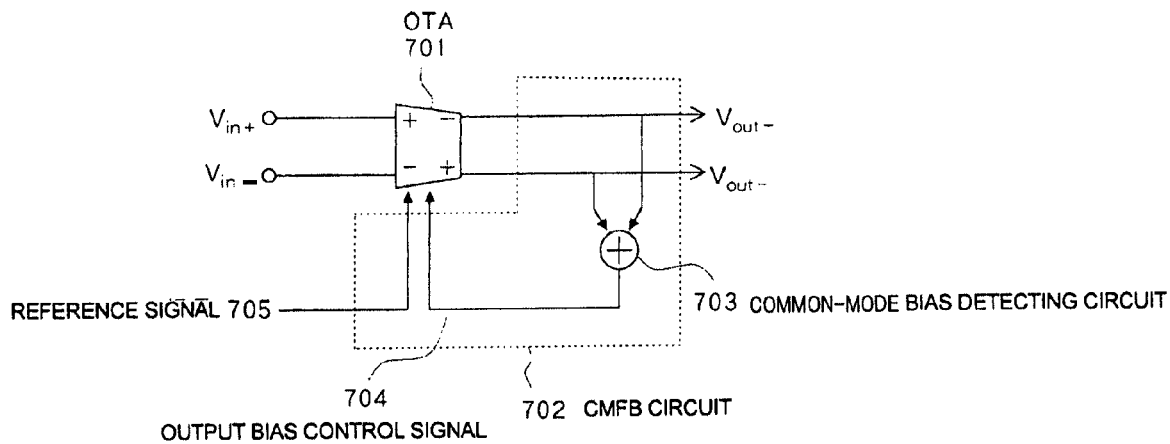
[FIG. 5a]
A block diagram conceptually showing the configuration of a CMFB circuit.
Figure 5B:
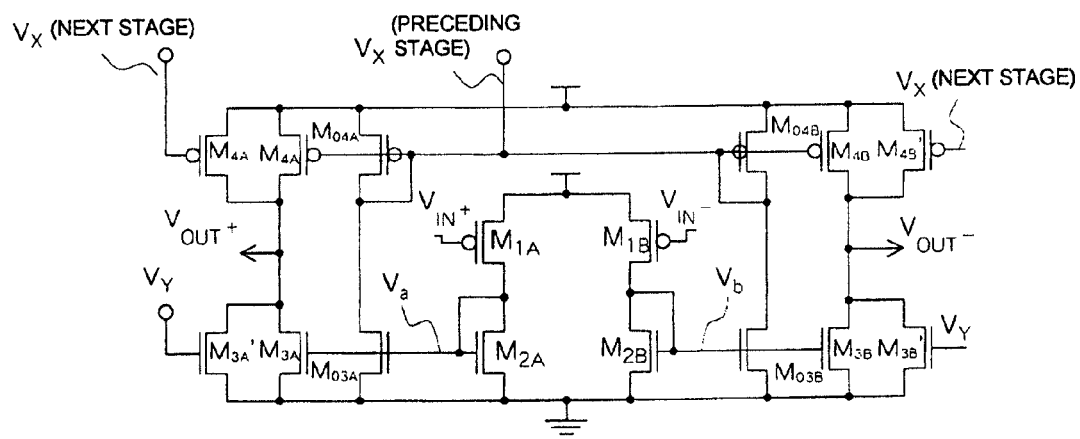
[FIG. 5b]
A circuit diagram showing a specific configuration of a CMFB circuit.
Figure 5C:
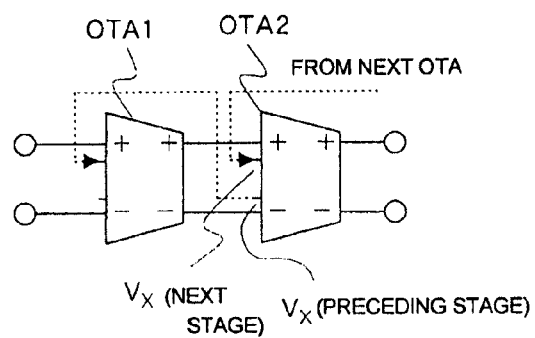
[FIG. 5c]
A block diagram showing an exemplary application of a CMFB circuit.
Figure 10:
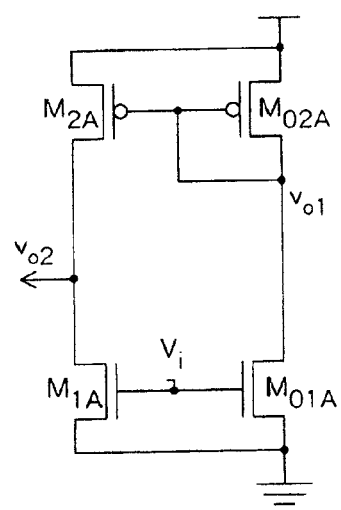
[FIG. 10]
A diagram for describing effects of the first embodiment according to the present invention.
Figure 11:
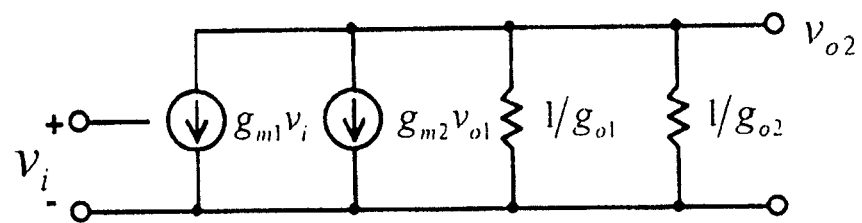
[FIG. 11]
A diagram for describing effects of the first embodiment according to the present invention.

FIG. 10 is a circuit diagram showing only a one-side portion of the circuit shown in FIG. 3, and FIG. 11 is an equivalent circuit diagram thereof.

In the circuit shown in FIG. 10, the relationship between input (common-mode input) $V_i$ and output $V_{o1}$ is represented by Equation (3) shown below:

[Equation 3]
$$v_{o1} = -\frac{g_{m1}}{g_{o1} + g_{o2} + g_{m2}} v_i \quad (3)$$

where $g_{m1}$ represents mutual conductance of $M_{1A}$, $M_{01A}$, and $g_{m2}$ represents mutual conductance of $M_{2A}$, $M_{02A}$, respectively, while $g_{o1}$ represents output conductance of $M_{1A}$, $M_{01A}$, and $g_{o2}$ represents output conductance of $M_{2A}$, $M_{02A}$, respectively.

From the equivalent circuit shown in FIG. 11 and Equation (3), the equation is expanded to derive the gain:

[Equation 4]
$$g_{m1}v_i + g_{m2}v_{o1} + g_{o1}v_{o2} + g_{o2}v_{o2} = 0 \quad (4)$$
$$g_{m1}v_i - \frac{g_{m1}g_{m2}}{g_{o1} + g_{o2} + g_{m2}} v_i + (g_{o1} + g_{o2})v_{o2} = 0$$
$$v_i\left(g_{m1} - \frac{g_{m1}g_{m2}}{g_{o1} + g_{o2} + g_{m2}}\right) + (g_{o1} + g_{o2})v_{o2} = 0$$
$$v_i\left(\frac{g_{o1}g_{m1} + g_{o2}g_{m1} + g_{m1}g_{m2} - g_{m1}g_{m2}}{g_{o1} + g_{o2} + g_{m2}}\right) + (g_{o1} + g_{o2})v_{o2} = 0$$
$$\left(\frac{g_{o1} + g_{o2}}{g_{o1} + g_{o2} + g_{m2}}\right)v_i g_{m1} = -(g_{o1} + g_{o2})v_{o2}$$
$$\frac{v_{o2}}{v_i} = -\frac{g_{m1}}{(g_{o1} + g_{o2} + g_{m2})}$$

Here, mutual conductance $g_m$ of a transistor is generally larger than output conductance $g_0$ by a factor of 10 to 100, so that when Equation (4) is simplified on the assumption that $g_m \gg g_o$ is satisfied, the resulting equation is represented as follows:

[Equation 5]
$$\frac{v_{o2}}{v_i} \approx -\frac{g_{m1}}{g_{m2}} \quad (5)$$

From the foregoing, in the example shown in FIG. 3, when an equal value is selected for mutual conductance $g_{m1}$, $g_{m2}$ of transistors $M_{1A}$, $M_{01A}$, $M_{2A}$, $M_{02A}$, the common-mode gain of the output with respect to the input signal is approximately −1 time from Equation (5). Also, supposing that values are selected for mutual conductance $g_{m1}$, m2 of transistors $M_{1A}$, $M_{01A}$, $M_{2A}$, $M_{02A}$ such that Equation (2) derives −1/10, mutual conductance $g_m$ is proportional to the size of the transistors, so that the shapes of p-ch transistors and n-ch transistors must be at 1:10. While the size of a transistor is determined in consideration of a reduction in source voltage, a noise margin, variations in performance of the transistor, and the like, the design becomes further difficult due to the ratio as mentioned above which is included in the condition.

Figure 12:
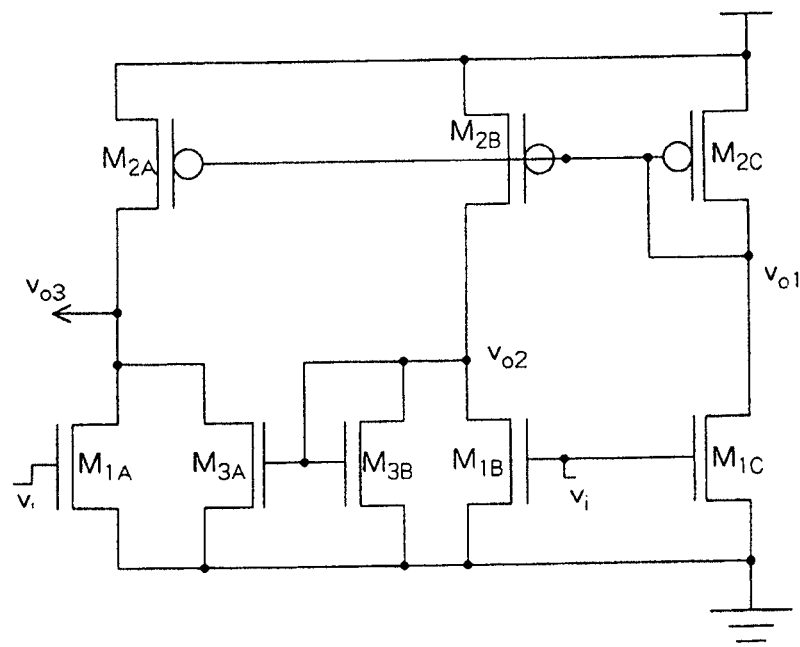
[FIG. 12]
A diagram for describing effects of the first embodiment according to the present invention.
Figure 13:
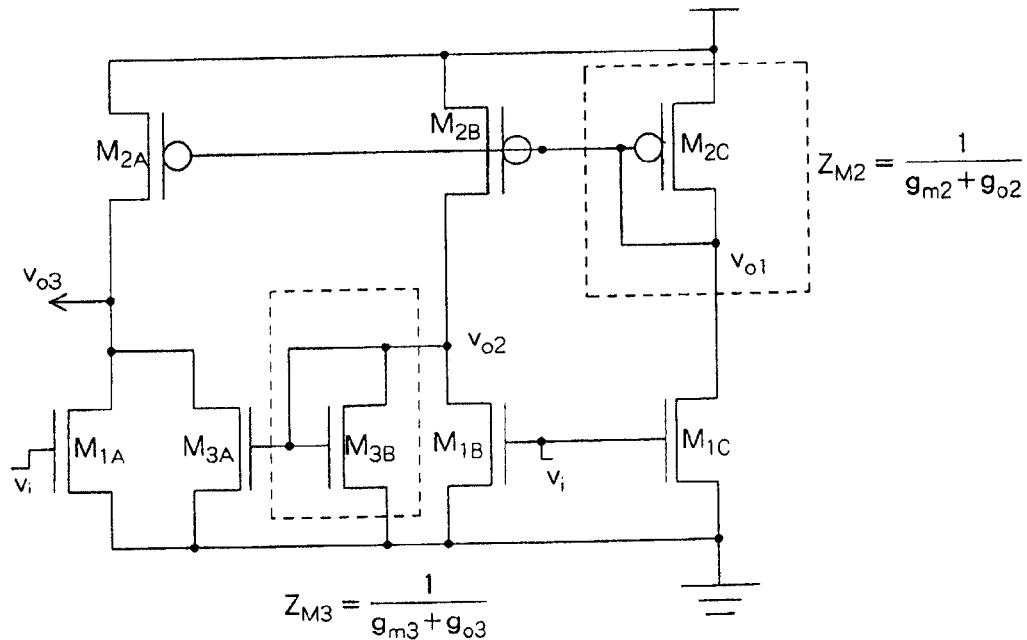
[FIG. 13]
A diagram for describing effects of the first embodiment according to the present invention.

Next, the OTA of this embodiment is analyzed. FIG. 12 is a circuit diagram showing only one-side portion of the circuit shown in FIG. 7. For purposes of analysis, transistors $M_{2C}$, $M_{3B}$ are replaced with loads $Z_{M2}$, $Z_{M3}$, as shown in FIG. 13.

Figure 14:
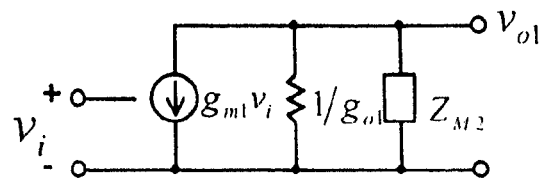
[FIG. 14]
A diagram for describing effects of the first embodiment according to the present invention.

First, $v_{o1}$ is derived. By considering the equivalent circuit shown in FIG. 14 in a manner similar to the derivation of Equation (2), the input/output relationship is represented as follows:

[Equation 6]
$$v_o = -\frac{g_{m1}}{(g_{o1} + g_{o2} + g_{m2})} v_i \quad (6)$$

Figure 15:
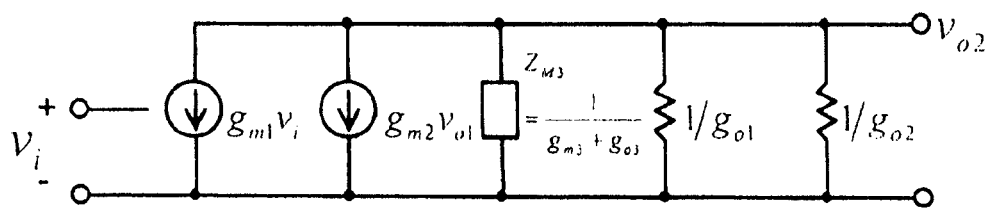
[FIG. 15]
A diagram for describing effects of the first embodiment according to the present invention.

Next, $v_{o2}$ is derived. Taking into account the equivalent circuit shown in FIG. 15 in which $Z_{M3}$, the input/output relationship is represented as follows:

[Equation 7]
$$0 = g_{m1}v_i - \frac{g_{m1}g_{m2}}{(g_{o1} + g_{o2} + g_{m2})} v_i + (g_{m3} + g_{o3})v_{o2} + g_{o1}v_{o2} + g_{o2}v_{o2} \quad (7)$$
$$v_i\left(\frac{g_{m1}g_{m2}}{g_{o1} + g_{o2} + g_{m2}} - g_{m1}\right) = (g_{o1} + g_{o2} + g_{o3} + g_{m3})v_{o2}$$
$$v_{o2} = \left(\frac{\frac{g_{m1}g_{m2}}{g_{o1} + g_{o2} + g_{m2}} - g_{m1}}{g_{o1} + g_{o2} + g_{o3} + g_{m2}}\right) v_i$$

Figure 16:
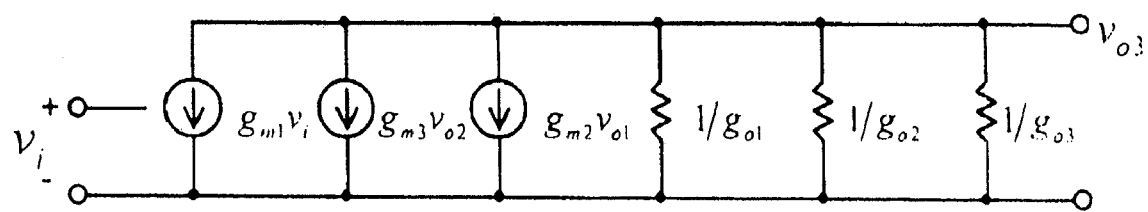
[FIG. 16]
A diagram for describing effects of the first embodiment according to the present invention.

Next, vo3 is derived using vo1, vo2 which was calculated in the foregoing manner. The equivalent circuit is, as shown in FIG. 16, and the input/output relationship is represented as follows:

[Equation 8]
$$0 = g_{m1}v_i + g_{m3}v_{o2} + g_{m2}v_{o1} + g_{o1}v_{o3} + g_{o2}v_{o3} + g_{o3}v_{o3}$$
$$0 = g_{m1}v_i + \left(\frac{\frac{g_{m1}g_{m2}}{g_{o1} + g_{o2} + g_{m2}} - g_{m1}}{g_{o1} + g_{o2} + g_{o3} + g_{m3}}\right)g_{m3}v_i -$$
$$\left(\frac{g_{m1}}{g_{o1} + g_{o2} + g_{m2}}\right)g_{m2}v_i + (g_{o1} + g_{o2} + g_{o3})v_{o3}$$
$$0 = \left(1 + \frac{\frac{g_{m2}g_{m3}}{g_{o1} + g_{o2} + g_{m2}} - g_{m3}}{g_{o1} + g_{o2} + g_{o3} + g_{m3}} - \frac{g_{m2}}{g_{o1} + g_{o2} + g_{m2}}\right)g_{m2}v_i +$$
$$(g_{o1} + g_{o2} + g_{o3})v_{o3}$$

When $g_{o1} + g_{o2} = A$,

[Equation 9]
$$0 = \left(1 + \frac{\frac{g_{m2}g_{m3}}{A + g_{m2}} - g_{m3}}{A + g_{o3} + g_{m3}} - \frac{g_{m2}}{A + g_{m2}}\right)g_{m1}v_i + (A + g_{o3})v_{o3}$$
$$0 = \left(1 + \frac{-Ag_{m3}}{(A + g_{m2})(A + g_{o3} + g_{m3})} - \frac{g_{m2}}{A + g_{m2}}\right)g_{m1}v_i + (A + g_{o3})v_{o3}$$
$$0 = \left(\frac{A^2 + Ag_{o3} + Ag_{m3} + Ag_{m2} + g_{m2}g_{o3} + g_{m2}g_{m3} -}{\frac{Ag_{m3} - Ag_{m2} - g_{m2}g_{o3} - g_{m2}g_{m3}}{(A + g_{m2})(A + g_{o3} + g_{m2})}}\right)$$
$$g_{m1}v_i + (A + g_{o3})v_{o3}$$

-continued $$0 = \left(\frac{A(A + g_{o3})}{(A + g_{m2})(A + g_{o3} + g_{m3})}\right) g_{m1} v_i + (A + g_{o3}) v_{o3}$$

$$v_{o3} = -\frac{A g_{m1}}{(A + g_{m2})(A + g_{o3} + g_{m3})} v_i$$

A substitution of A results in the following equation:

[Equation 10]

$$v_{o3} = -\frac{(g_{o1} + g_{o2}) g_{m1}}{(g_{o1} + g_{o2} + g_{m2})(g_{o1} + g_{o2} + g_{o3} + g_{m3})} v_i \quad (8)$$

When $g_{o1}+g_{o2} \ll g_{m2}$ and $g_{o1}+g_{o2}+g_{o3} \ll g_{m3}$,

[Equation 11]

$$v_{o3} \cong -\frac{g_{m1}}{g_{m2} g_{m3}} (g_{o1} + g_{o2}) v_i \quad (9)$$

[Equation 12]

$$\frac{v_{o3}}{v_i} \cong -\frac{g_{m1}}{g_{m2} g_{m3}} (g_{o1} + g_{o2}) \quad (10)$$

where $g_{m1}$, $g_{m2}$, $g_{m3}$ represent the mutual conductance of transistors $M_{1A}$, $M_{1B}$, $M_{1C}$, $M_{2A}$, $M_{2B}$, $M_{2C}$, $M_{3A}$, $M_{3B}$, and $g_{01}$, $g_{02}$, $g_{03}$ represent the output conductance of $M_{1A}$, $M_{1B}$, $M_{1C}$, $M_{2A}$, $M_{2B}$, $M_{2C}$, $M_{3A}$, $M_{3B}$. Generally, the mutual conductance of transistors is larger than the output conductance by a factor of 10 to 100, Equation (9) can be simplified as Equation (10).

Here, for comparing the circuit of this embodiment with the related art described with reference to FIG. 3, $g_{m1}$, $g_{m2}$ of the transistors in FIG. 3 and the transistors in FIG. 7 are made the same, and the ratio of Equation (4) to Equation (8) is taken as follows:

[Equation 13]

$$\frac{\frac{v_{o3}}{v_i}}{\frac{v_{o2}}{v_i}} = \frac{(g_{o1} + g_{o2}) g_{m1}}{(g_{o1} + g_{o2} + g_{m2})(g_{o1} + g_{o2} + g_{o3} + g_{m3})} \bigg/ \frac{g_{m1}}{(g_{o1} + g_{o2} + g_{m2})}$$

$$\frac{\frac{v_{o3}}{v_i}}{\frac{v_{o2}}{v_i}} = \frac{g_{o1} + g_{o2}}{g_{o1} + g_{o2} + g_{o3} + g_{m3}}$$

[Equation 14]

$$\frac{\frac{v_{o3}}{v_i}}{\frac{v_{o2}}{v_i}} \cong \frac{g_{o1} + g_{o2}}{g_{m3}} \quad (11)$$

As is apparent from Equation (11), assuming that the mutual conductance $g_m$ of the transistors is larger than output conductance $g_o$ by a factor of 10 to 100, it is understood that the gain of the common-mode component can be reduced to ⅕ to 1/50. Accordingly, when the circuit configuration of this embodiment is used, the design can be made without paying any concern to limiting the size of transistors due to the common-mode gain, resulting in the design with a higher degree of freedom.

While this embodiment has been described on the assumption that the transistors which form part of the circuit comprise p-mos transistors and n-mos transistors, the circuit may be made up of JFETs and bipolar transistors. Also, the p-mos transistors shown in FIG. 7 may be replaced with n-mos transistors, and the n-mos transistors may be replaced with p-mos transistors. This applies to other embodiments.

(Exemplary Modification 1 to First Embodiment)

Figure 17:
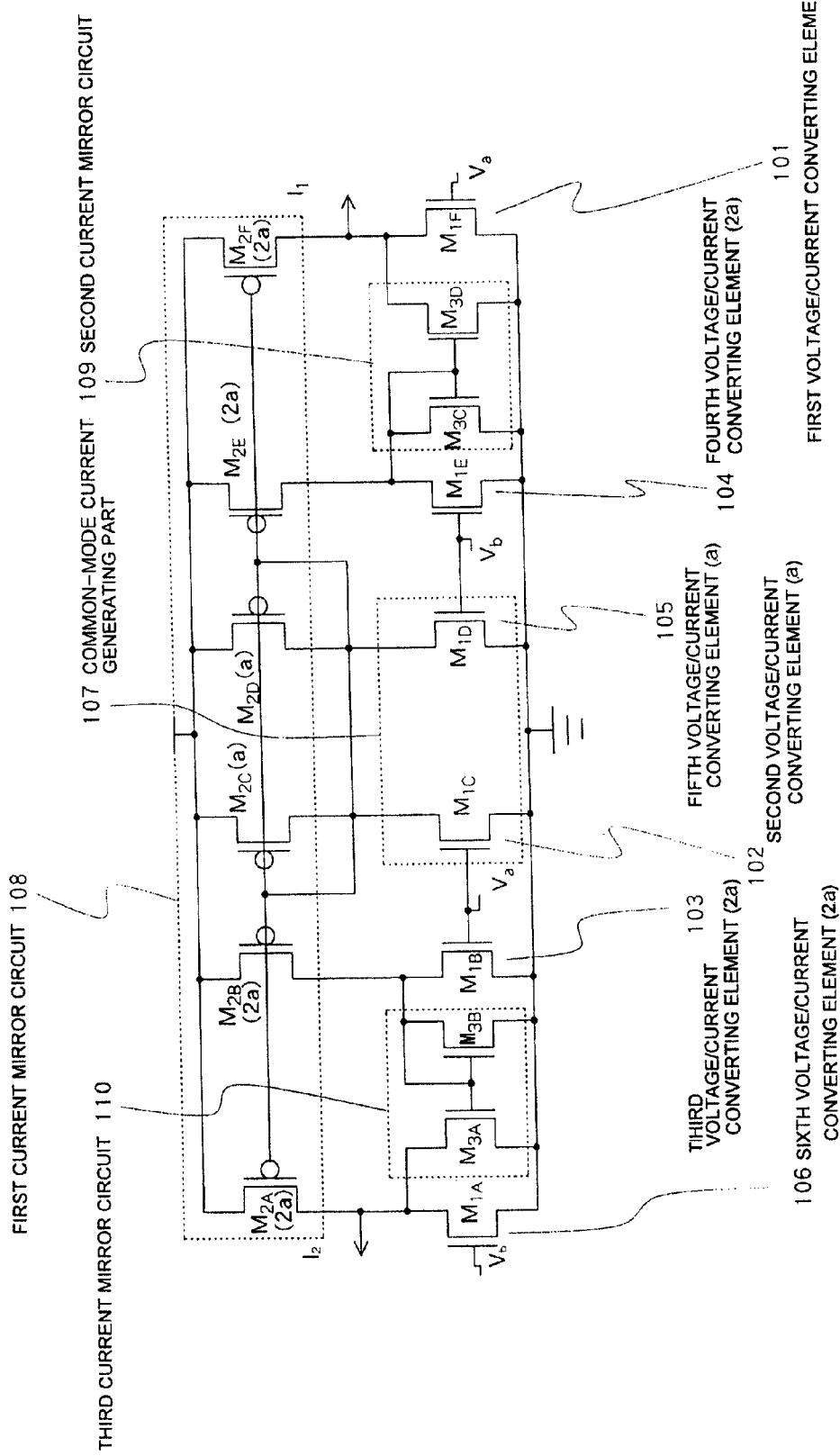
[FIG. 17]
A circuit diagram showing a first exemplary modification to the first embodiment according to the present invention.

FIG. 17 is a circuit diagram showing an exemplary modification to the first embodiment. FIG. 17 differs from the first embodiment in that the second voltage/current converting element and fifth voltage/current converting element, which form part of the common-mode current generating part, are smaller than the remaining voltage/current converting elements. Here, the size of transistors $M_{1C}$ and $M_{1D}$ (=W/L) is chosen to be a, while the size of transistors $M_{1A}$, $M_{1B}$, $M_{1E}$, $M_{1F}$ is chosen to be 2a. While the size of transistors $M_{3A}$, $M_{3B}$, $M_{3C}$, $M_{3D}$ can be determined irrespective of transistors $M_{1C}$, $M_{1D}$ and transistors $M_{1A}$, $M_{1B}$, $M_{1E}$, $M_{1F}$, the size is herein chosen to be 2a.

Likewise, the size of transistors $M_{2C}$, $M_{2D}$ which forms part of the first current mirror circuit is also chosen to be a, and the size of transistors $M_{2A}$, $M_{2B}$, $M_{2E}$, $M_{2F}$ is 2a. In other words, the ratio of the size of transistors $M_{1C}$ and $M_{1D}$ which make up the common-mode current generating circuit to the size of transistors $M_{1A}$, $M_{1B}$, $M_{1E}$, $M_{1F}$, which are the remaining voltage/current converting elements, is set to 1:2, and within the first mirror circuit, the ratio of the size of transistors $M_{2C}$, $M_{2D}$ connected to transistor $M_{1C}$, $M_{1D}$ to the size of remaining transistors $M_{2A}$, $M_{2B}$, $M_{2E}$, $M_{2F}$ is also set to 1:2 in a similar manner.

Such a configuration can reduce the current flowing through common-mode current generating part 107, making it possible to reduce the input impedance. Also, the power consumption can be reduced by reducing transistors not related to transistors which make up the output stage ($M_{1A}$, $M_{2A}$, $M_{3A}$, $M_{1F}$, $M_{2F}$, $M_{3D}$).

Also, in this embodiment, the ratio of the sizes (transistors $M_{1C}$, $M_{1D}$):(transistors $M_{1A}$, $M_{1B}$, $M_{1E}$, $M_{1F}$, $M_{3A}$, $M_{3B}$, $M_{3C}$, $M_{3D}$) is set to 1:2, but transistors of any size may be used as long as 1:n (n>1). Also, the size of $M_{3A}$, $M_{3B}$, $M_{3C}$, $M_{3D}$ can be independently set.

(Exemplary Modification 2 to First Embodiment)

Figure 18:
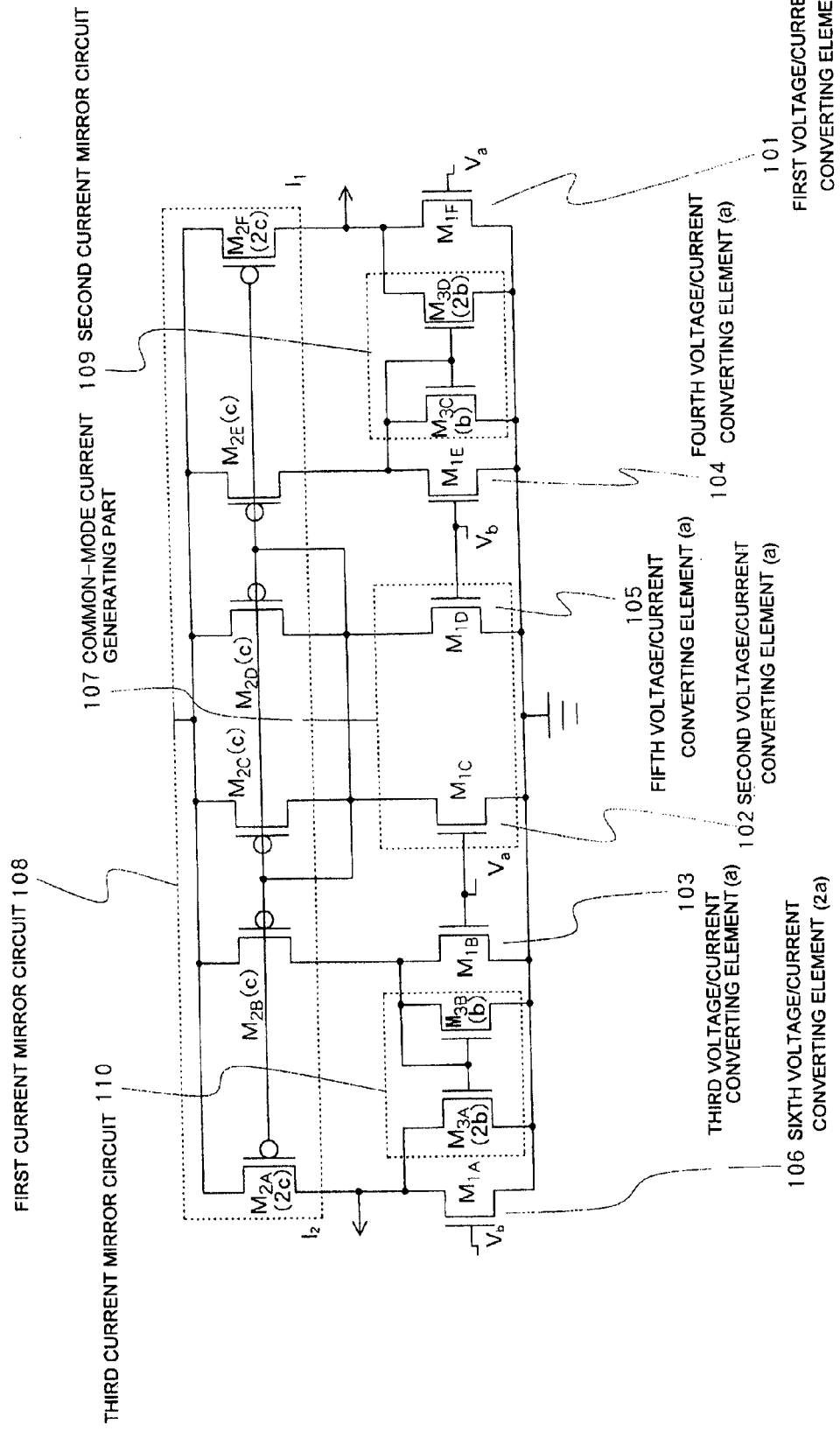
[FIG. 18]
A circuit diagram showing a second exemplary modification to the first embodiment according to the present invention.

FIG. 18 is a circuit diagram showing an exemplary modification to the first embodiment. FIG. 18 differs from the first embodiment in that the size of transistors $M_{1C}$, $M_{1B}$, $M_{1D}$, $M_{1E}$ is chosen to be a, while the size of transistors $M_{1A}$, $M_{1F}$ is chosen to be 2a, so that they are at a ratio of 2:1; the size of transistors $M_{3B}$, $M_{3C}$ is chosen to be b, while the size of transistors $M_{3A}$, $M_{3D}$ is chosen to be 2b, so that they are at a ratio of 2:1; and the size of transistors $M_{2B}$, $M_{2D}$, $M_{2B}$, $M_{02E}$ is chosen to be c, while the size of transistors $M_{2A}$, $M_{2F}$ is chosen to be 2c, so that they are in a ratio of 1:2.

With such a configuration, part of transistors can be reduced in area, thus making it possible to produce an effect of reducing the overall circuit area, while having similar effects to those of the first embodiment. Also, in this embodiment, the ratio of the sizes is set to 2:1, but transistors of any size may be used as long as n:1 (n>1), in a manner similar to Exemplary Modification 1 to the first embodiment. Also, the sizes of the transistors can be changed in a similar manner.

Alternatively, a well separation type, which is effective in reducing noise, can be used for the n-mos transistors.

The foregoing contents related to the transistors are similar in each embodiment described below.

Second Embodiment

Figure 19:
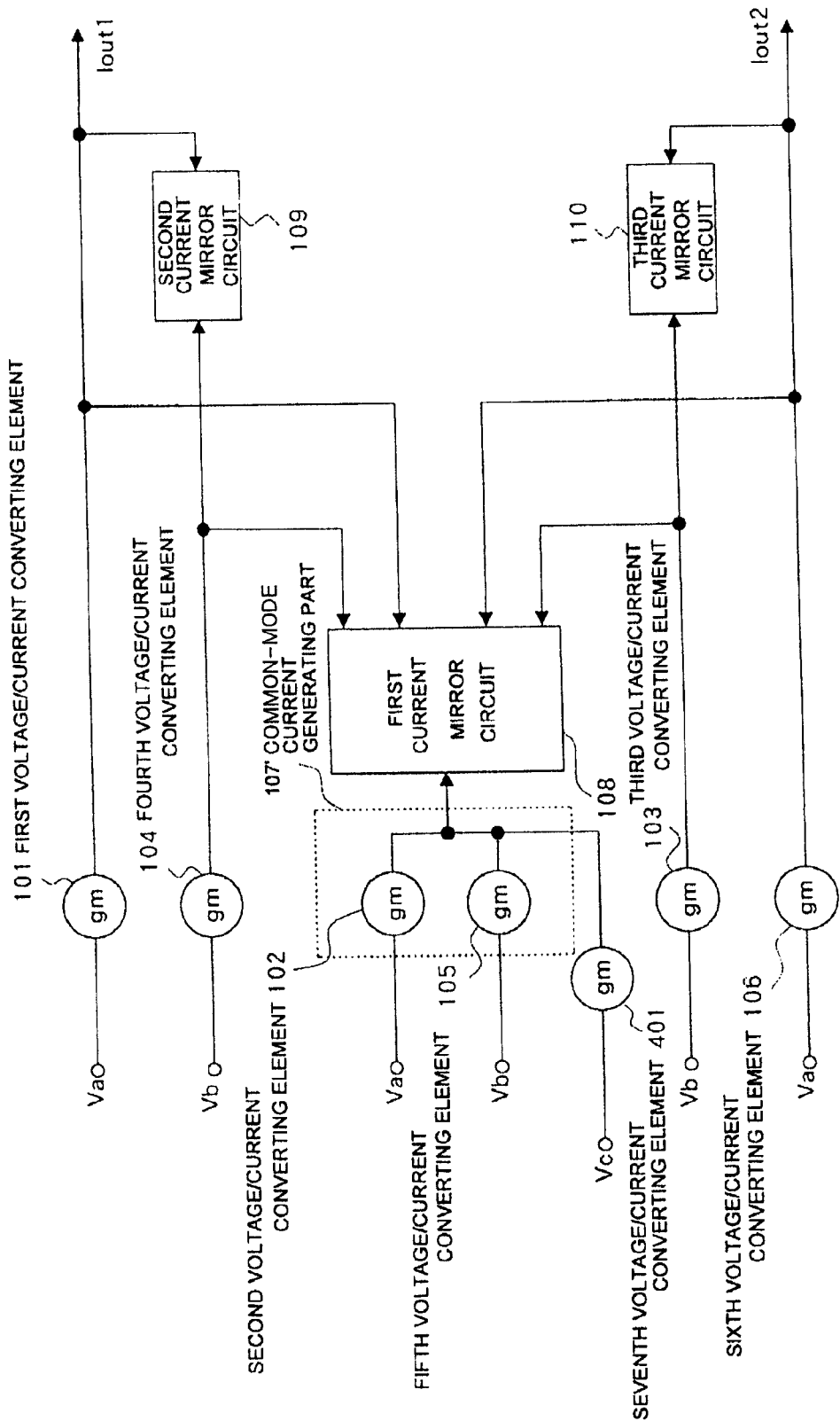
[FIG. 19]
An equivalent circuit diagram showing the configuration of a second embodiment according to the present invention.
Figure 20:
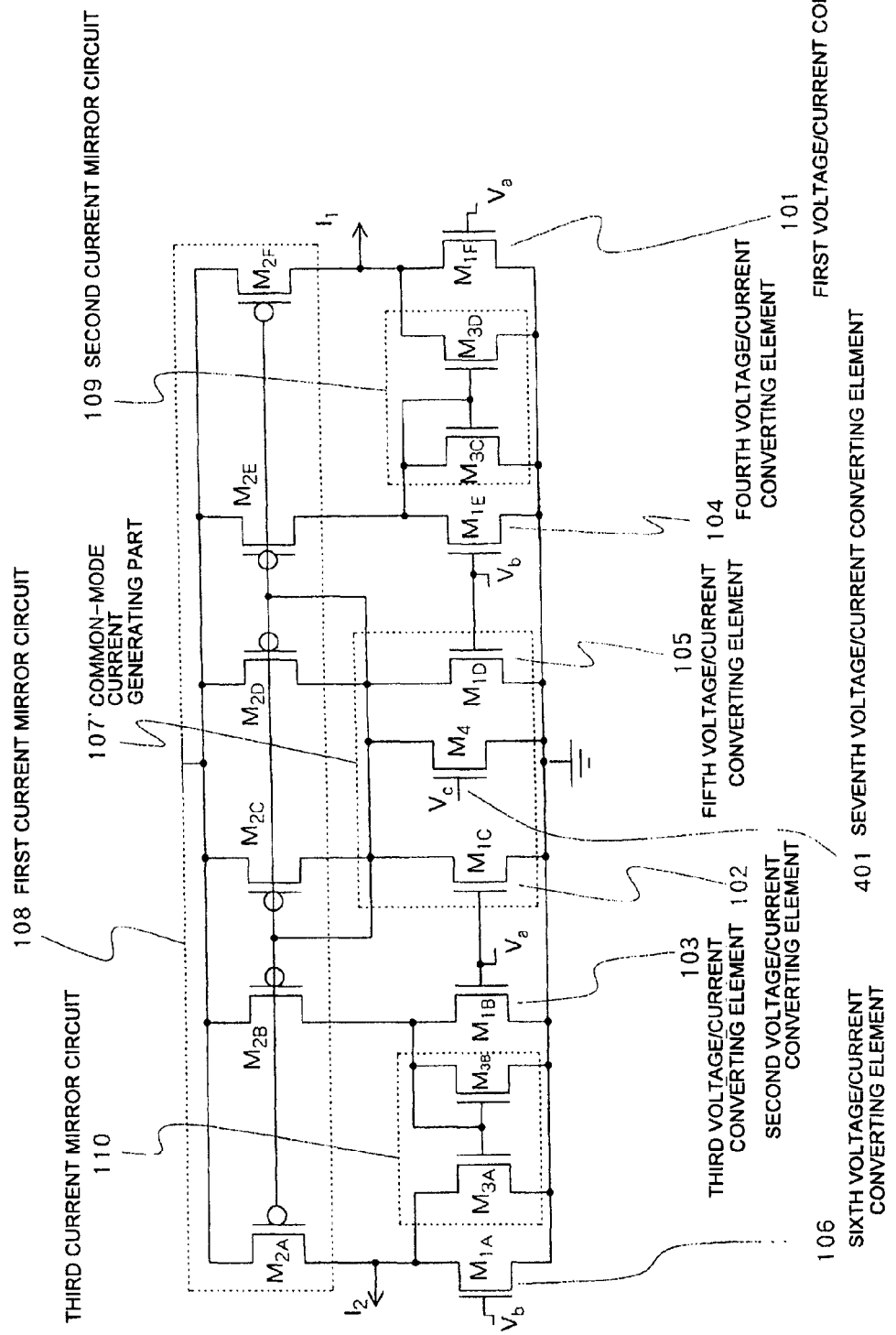
[FIG. 20]
A circuit diagram showing the configuration of the second embodiment according to the present invention.

FIGS. 19 and 20 are diagrams showing the configuration of a second embodiment, where FIG. 19 is an equivalent circuit, and FIG. 20 is a circuit diagram.

This embodiment comprises seventh voltage/current converting element 401 in common-mode current generating part 107 in the first embodiment to provide common-mode current generating part 107'. In the circuit diagram specifically shown in FIG. 20, seventh voltage/current converting element 401 comprises source-grounded n-mos transistor $M_4$. N-mos transistor $M_4$ has a drain connected in common to each gate of p-mos transistors $M_{2A}$-$M_{2F}$, and a gate applied with bias voltage $V_c$.

In the first embodiment, when an error component included in an output current of first current mirror circuit 108 is very small, the current flowing through transistors $M_{2A}$-$M_{2F}$ is substantially the same as the current flowing through transistors $M_{1A}$-$M_{1F}$. In this state, no bias current flows into transistors $M_{3A}$-$M_{3D}$ which make up second current mirror circuit 109 and third current mirror circuit 110, but instead the current flows into transistors $M_{3A}$-$M_{3D}$ only in half waves of a signal, causing a loss in the signal.

In this embodiment, the seventh voltage/current converting element is provided at an input of first current mirror circuit 108 to supply the input of first current mirror circuit 108 with DC voltage $V_c$ not related to a signal, thus making it possible to cause the current flowing through transistors $M_{2A}$-$M_{2F}$ to be larger than the current flowing through transistors $M_{1A}$-$M_{1F}$ at all times. DC current $V_c$, called herein, may be of any magnitude as long as it has a value from a grounding point to a source voltage. As a result, it is possible to solve a problem in which a bias current experiences difficulties in flowing into transistors $M_{3A}$-$M_{3D}$, which make up second current mirror circuit 109 and third current mirror circuit 110, and to process a differential signal over a full wave rather than half wave, making it less likely to produce a loss in the signal.

Third Embodiment

Figure 21:
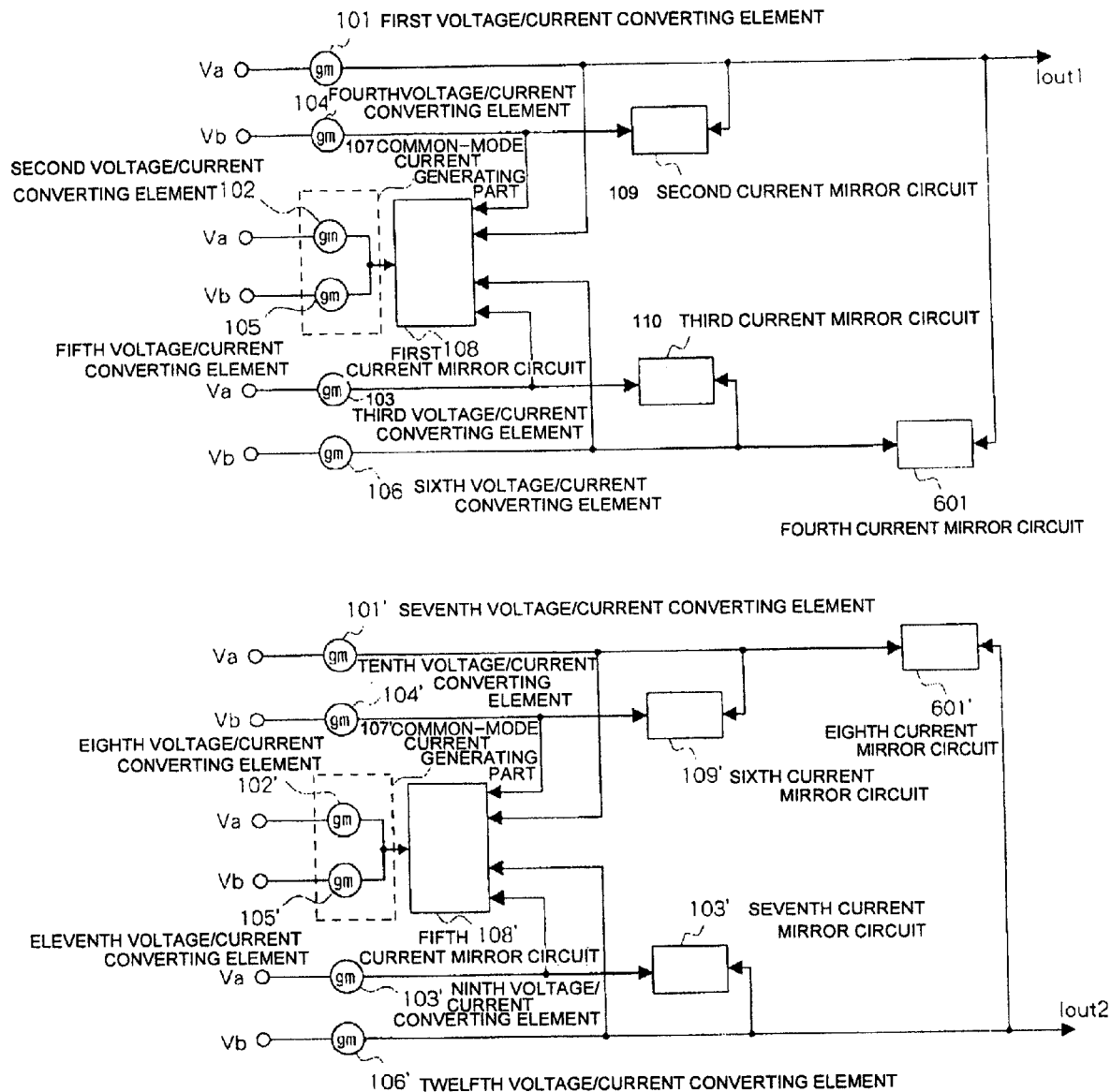
[FIG. 21]
An equivalent circuit showing the configuration of a third embodiment according to the present invention.

FIG. 21 is an equivalent showing the configuration of a third embodiment according to the present invention.

In the configuration of this embodiment, in addition to the OTA made up of first to sixth voltage/current converting elements 101-106, common-mode current generating part 107, and first to third current mirror circuits 108-110 of the first embodiment shown in FIG. 6, an OTA having the same configuration as this is provided. Seventh to twelfth voltage/current converting elements 101'-106', common-mode current generating part 107', and fifth to seventh current mirror circuits 108'-110', respectively, operate in a similar manner to first to sixth voltage/current converting elements 101-106, common-mode current generating part 107, and first to third current mirror circuits 108-110.

In this embodiment, fourth current mirror circuit 601 is provided between third current mirror circuit 110 of the OTA which generates $I_{OUT1}$ and the output, and eighth current mirror 601' is provided between sixth current mirror circuit 109' of the OTA which generates $I_{OUT2}$ and the output, to remove common-mode components by each current mirror circuit, thus further improving the common-mode gain reduction effect.

Fourth Embodiment

Figure 22:
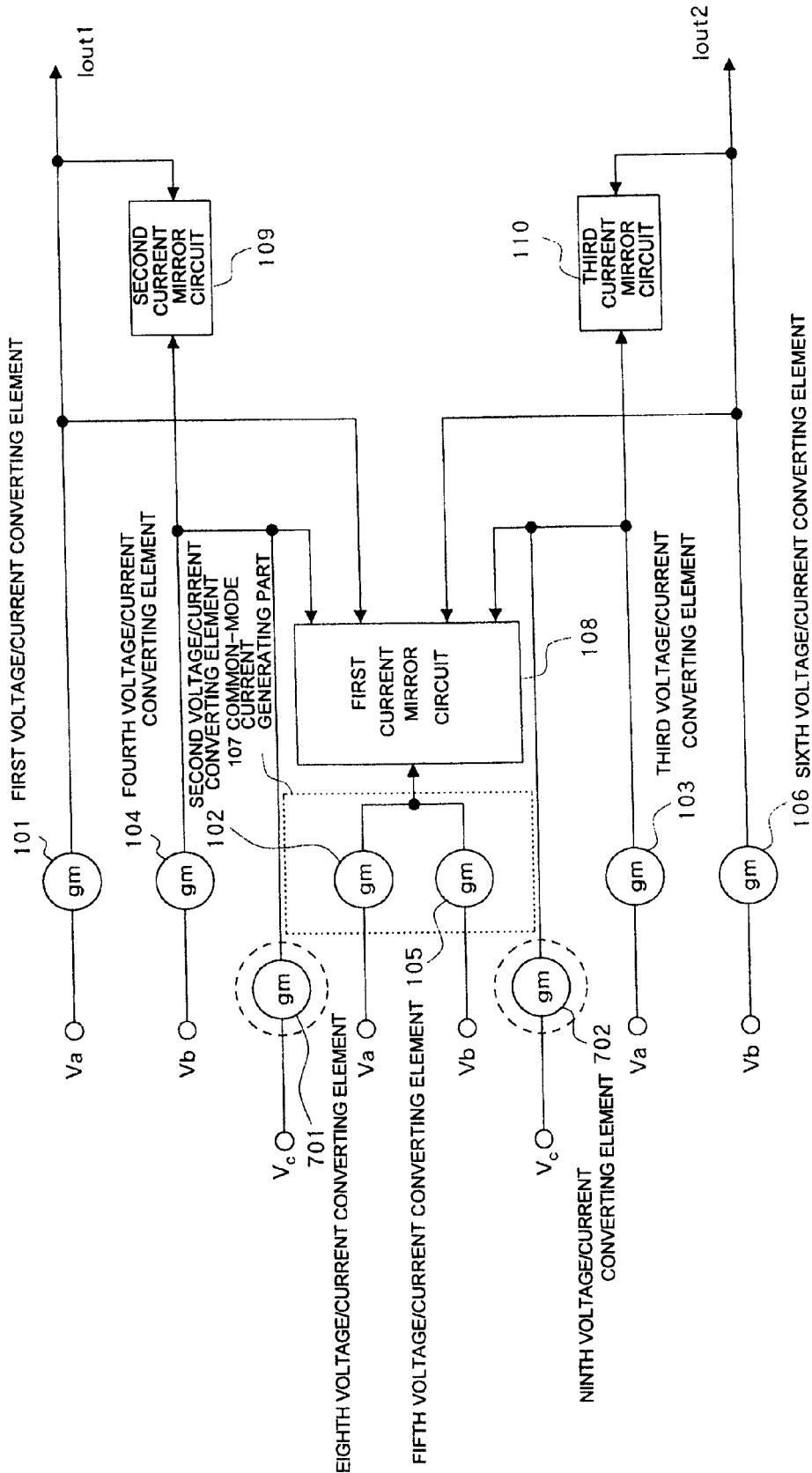
[FIG. 22]
An equivalent circuit diagram showing the configuration of a fourth embodiment according to the present invention.
Figure 23:
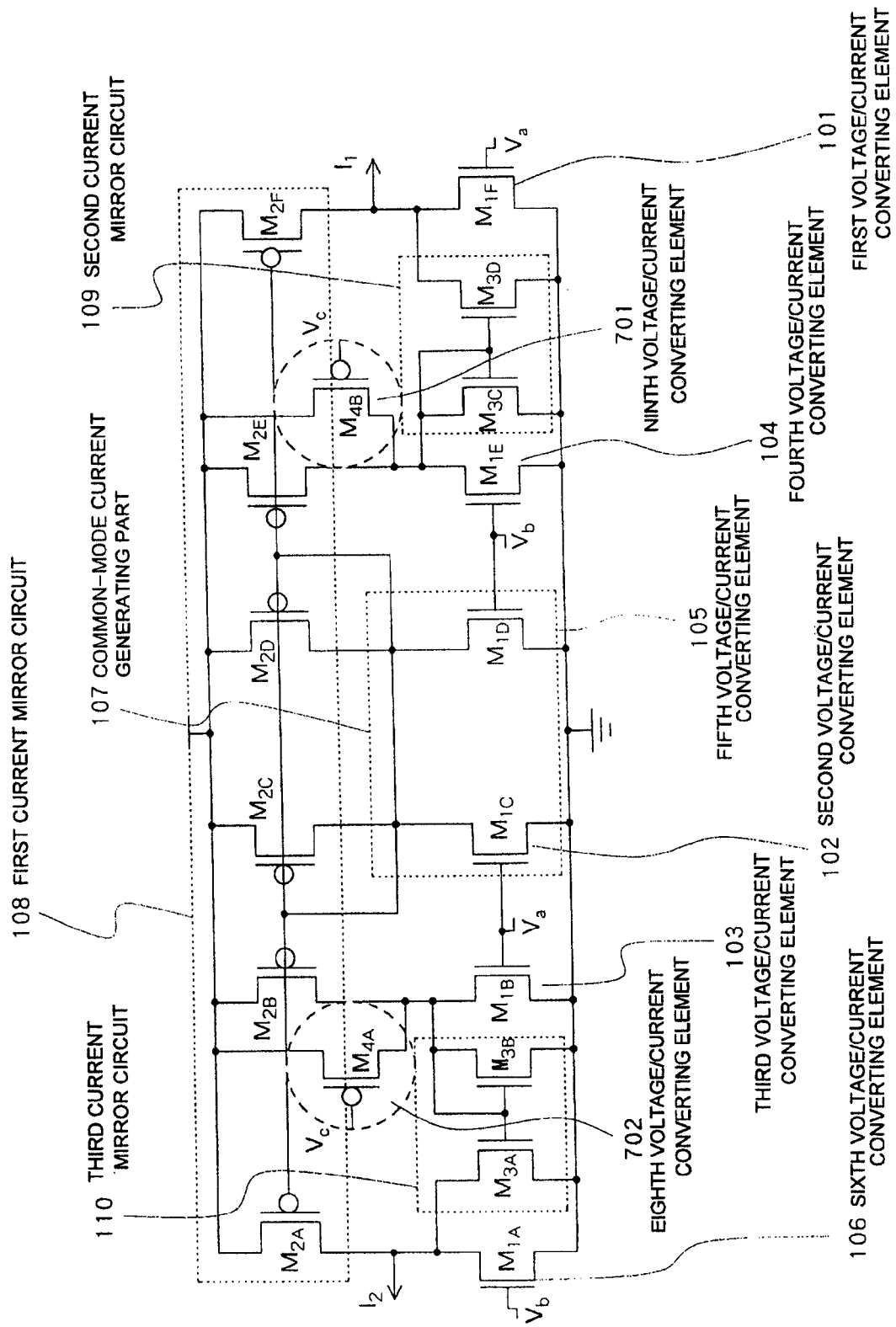
[FIG. 23]
A circuit diagram showing the configuration of the fourth embodiment according to the present invention.

FIGS. 22 and 23 are diagrams showing the configuration of a fourth embodiment according to the present invention, where FIG. 22 is an equivalent circuit diagram, and FIG. 23 is a circuit diagram.

This embodiment comprises eighth voltage/current converting element 701 and ninth voltage/current converting element 702 added to the first embodiment. In the circuit diagram specifically shown in FIG. 23, eighth voltage/current converting element 701 and ninth voltage/current converting element 702 are shown as p-mos transistors $M_{4B}$, $M_{4A}$. P-mos transistor $M_{4B}$ has a source connected to a power supply, and a drain connected to gates of $M_{3C}$, $M_{3D}$ which make up the second current mirror circuit, while p-mos transistor $M_{4A}$ has a source connected to the power supply, and a drain connected to gates of $M_{3A}$, $M_{3B}$ which make up the third current mirror circuit. Gates of p-mos transistors $M_{4B}$, $M_{4A}$ are applied with bias voltage $V_c$.

As described above, in the first embodiment, when an error component included in an output current of first current mirror circuit 108 is very small, no bias current flows into transistors $M_{3A}$-$M_{3D}$ which make up second current mirror circuit 109 and third current mirror circuit 110, but instead a current flows into transistors $M_{3A}$-$M_{3D}$ only in half waves of a signal, causing a loss in the signal.

In this embodiment, eighth voltage/current converting element 701 and ninth voltage/current converting element 702 are provided at inputs of second current mirror circuit 109 and third current mirror circuit 110 to supply the inputs of second current mirror circuit 109 and third current mirror circuit 110 with DC voltage $V_c$ not related to a signal, thereby making it possible to address the problem in which no bias current flows into transistors $M_{3A}$-$M_{3D}$ which make up second current mirror circuit 109 and third current mirror circuit 110, and to process a differential signal over a full wave rather than half wave, making it less likely to produce a loss in the signal.

Fifth Embodiment

Figure 24:
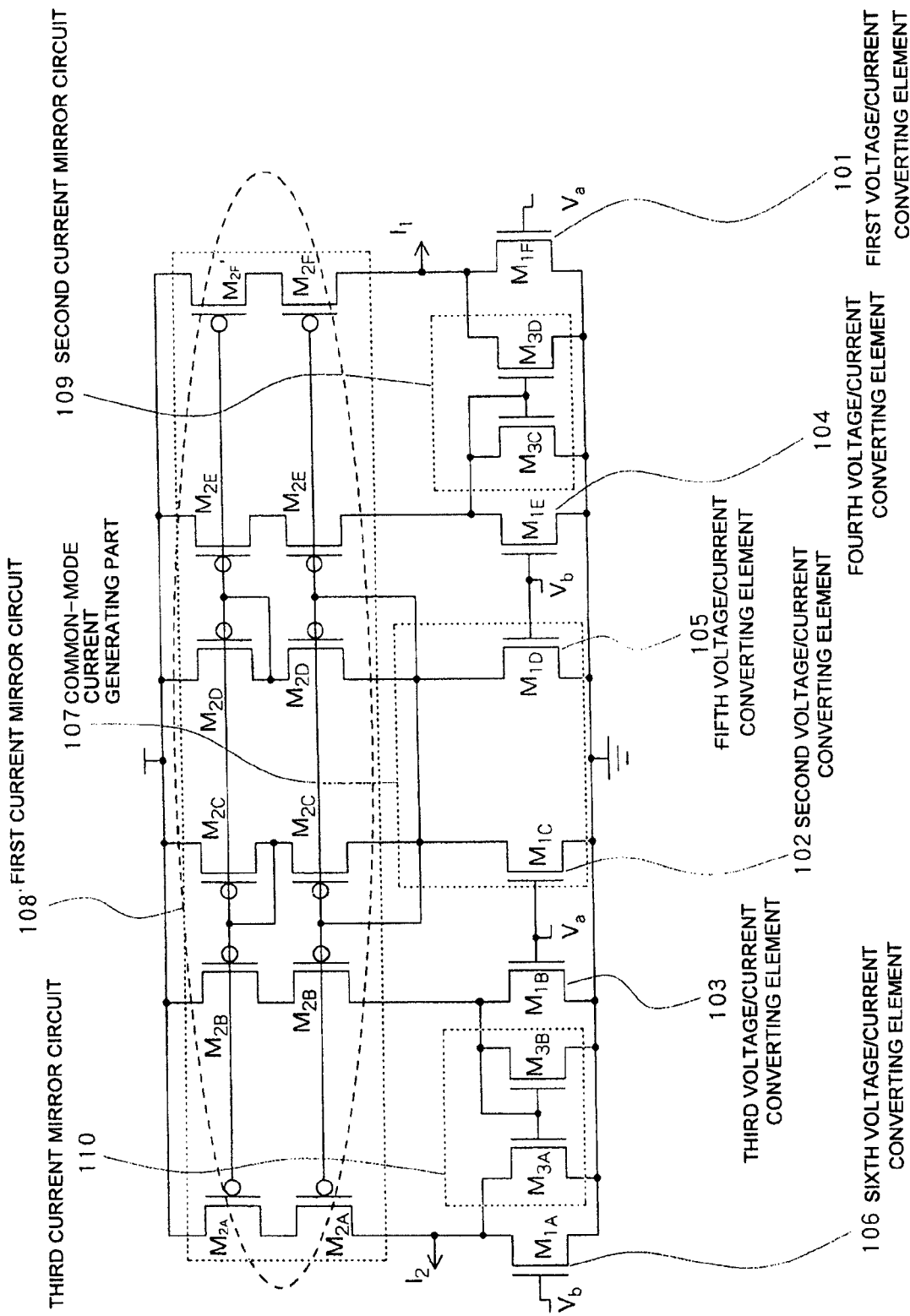
[FIG. 24]
A circuit diagram showing the configuration of a fifth embodiment according to the present invention.

FIG. 24 is a circuit diagram showing the configuration of a fifth embodiment according to the present invention.

In this embodiment, first current mirror circuit 108 made up of p-mos transistors $M_{2A}$-$M_{2F}$ in the first embodiment shown in FIG. 7 is designed in a two-stage configuration with p-mos transistors $M_{2A}'$-$M_{2F}'$, identical in configuration to p-mos transistors $M_{2A}$-$M_{2F}$, provided between first current mirror circuit 108 and a power supply, for use as first current mirror circuit 108'.

Some transistors developed in recent years have low threshold voltages, and this embodiment employs such transistors as transistors which make up the first current mirror circuit. By arranging the transistors at two stages, the output impedance can be increased, though the proportion of the amplitude width occupying in a source voltage becomes lower, thus improving the amplification accuracy.

Sixth Embodiment

Figure 25:
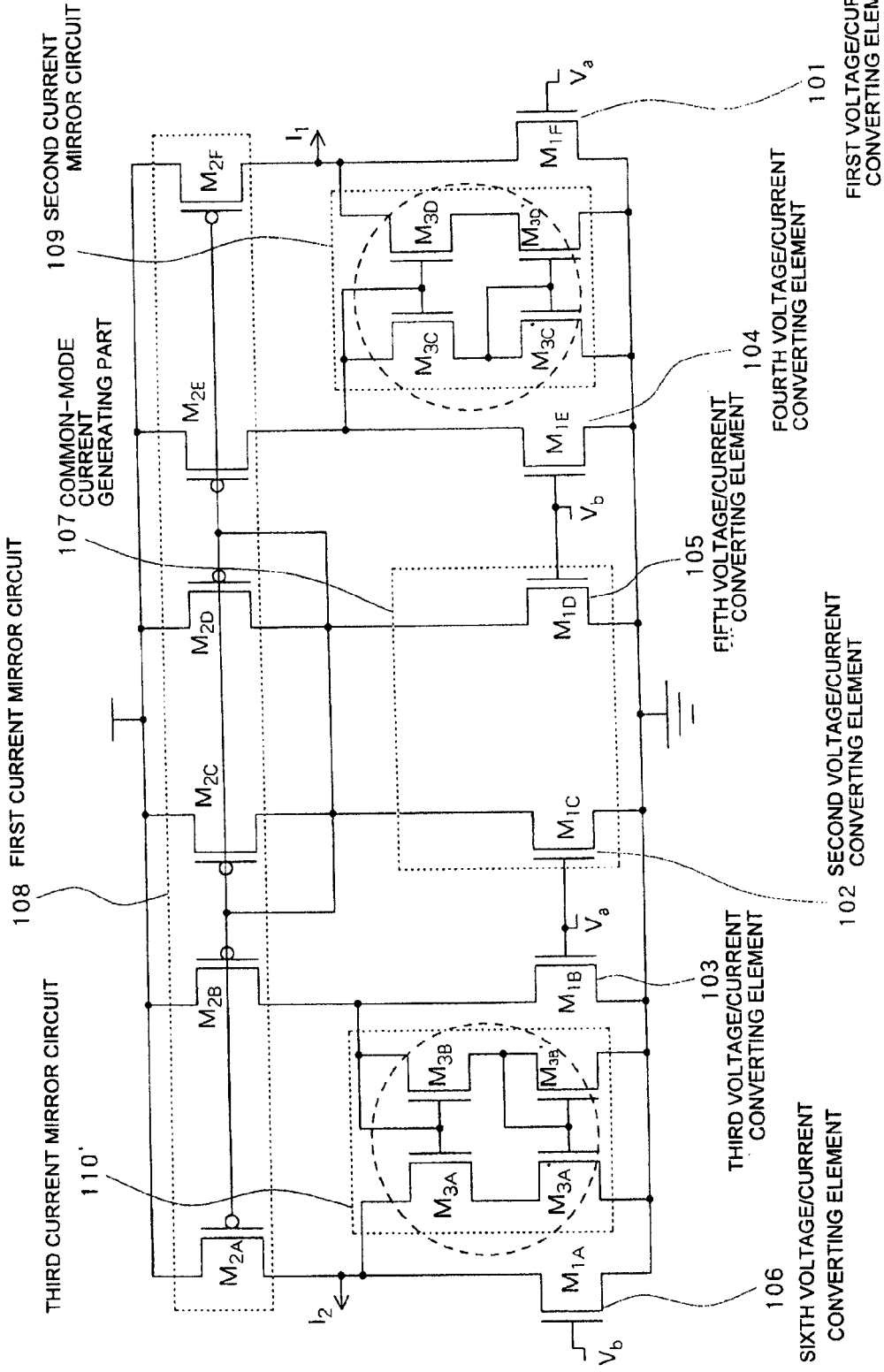
[FIG. 25]
A circuit diagram showing the configuration of a sixth embodiment according to the present invention.

FIG. 25 is a circuit diagram showing the configuration of a sixth embodiment.

This embodiment is also based on the premise that it uses transistors which have low threshold voltages, as is the case with the fifth embodiment.

In this embodiment, second current mirror circuit 109 made up of n-mos transistors $M_{3C}$, $M_{3D}$ and third current mirror circuit 110 made up of n-mos transistors $M_{3A}$, $M_{3B}$ in the first embodiment shown in FIG. 7 are designed in a two-stage configuration with n-mos transistors $M_{3C}'$, $M_{3D}'$, identical in configuration to n-mos transistors $M_{3C}$, $M_{3D}$, and n-mos transistors $M_{3A}'$, $M_{3B}'$, identical in configuration to n-mos transistors $M_{3A}$, $M_{3B}$, provided between second and third current mirror circuit 108, 109 and a ground, for use as second current mirror circuit 109', and third current mirror circuit 110'. Likewise, in this embodiment, the amplification accuracy is improved as is the case with the fifth embodiment.

Seventh Embodiment

Figure 26:
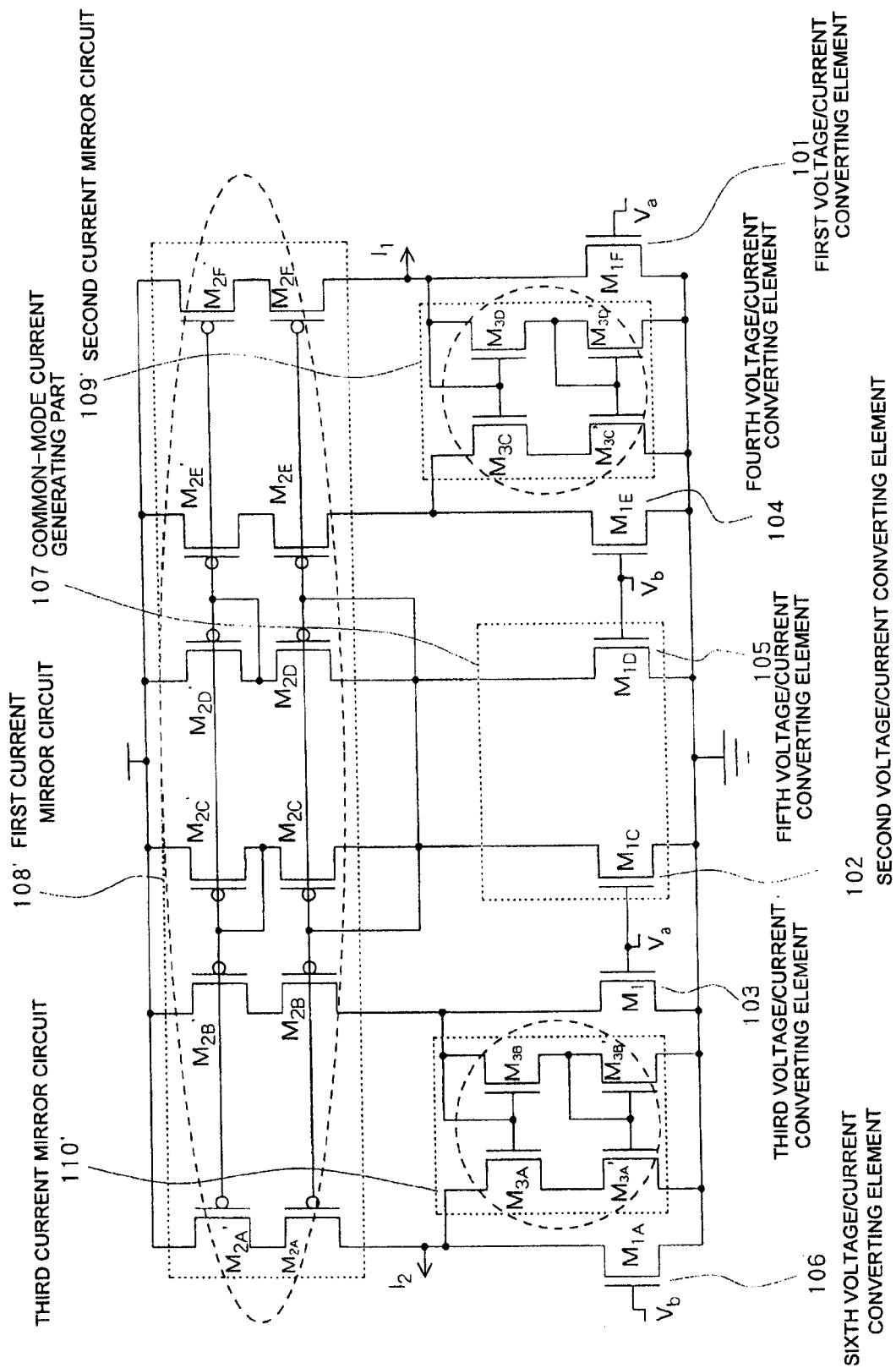
[FIG. 26]
A circuit diagram showing the configuration of a seventh embodiment according to the present invention.

FIG. 26 is a circuit diagram showing the configuration of a seventh embodiment according to the present invention.

This embodiment is a combination of the fifth embodiment shown in FIG. 24 with the sixth embodiment shown in FIG. 25, wherein first mirror circuit 108 shown in FIG. 7 is replaced with current mirror circuit 108' shown in FIG. 24, and second mirror circuit 109 and third current mirror circuit 110 shown in FIG. 7 are replaced with second current mirror circuit 109' and third current mirror circuit 110' shown in FIG. 25. In this embodiment, the effects of the fifth embodiment can be synergistically combined with the effects of the sixth embodiment.

While the foregoing fifth to seventh embodiments have been described in connection with examples in which each current mirror circuit is designed in a two-stage configuration, the current mirror circuit can be designed in a more-stage configuration in accordance with a reduction in threshold voltage, and may of course be in such a configuration.

Eighth Embodiment

Figure 27:
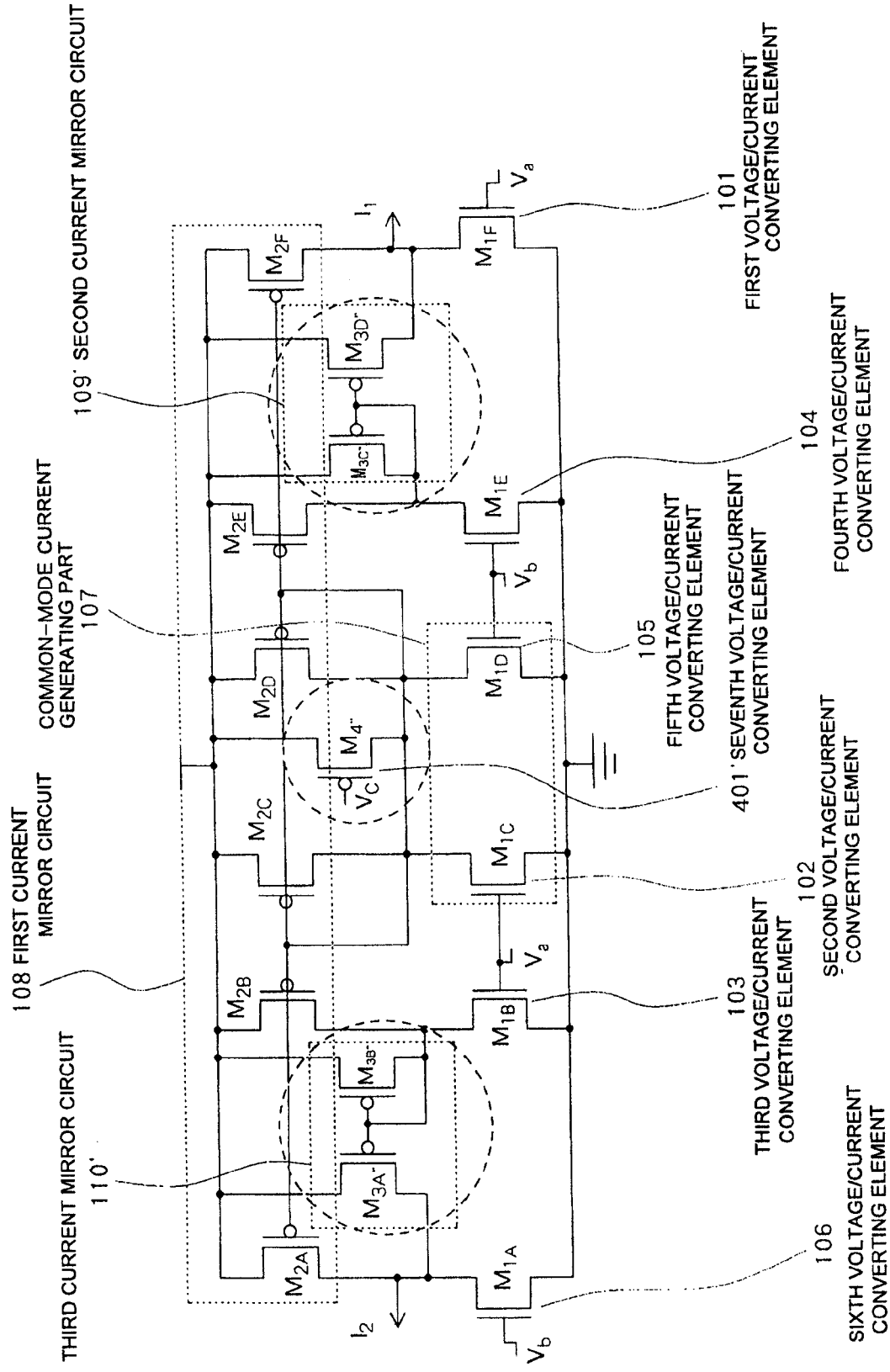
[FIG. 27]
A circuit diagram showing the configuration of an eighth embodiment according to the present invention.

FIG. 27 is a circuit diagram showing the configuration of an eighth embodiment.

In this embodiment, seventh voltage/current converting element 401, second current mirror circuit 109, and third current mirror circuit 110, which are made up of n-mos transistors in the second embodiment shown in FIG. 10, are replaced with seventh voltage/current converting circuit 401', second current mirror circuit 109', and third current mirror circuit 110' which are made up of p-mos transistors.

P-mos transistor $M_4''$, which is seventh voltage/current converting element 401', which is applied at a gate with DC voltage $V_c$ for generating a bias current, has a source connected to a power supply, and a drain connected to the gates of p-mos transistors $M_{2A}$-$M_{2F}$ which make up the first current mirror circuit.

Each of p-mos transistors $M_{3C}''$, $M_{3D}''$ which make up second current mirror circuit 109' has a source connected to the power supply, and a gate connected to the drains of p-mos transistor M2E and n-mos transistor M1E. P-mos transistor $M_{3C}''$ has a drain connected to the gate of each p-mos transistor $M_{3C}''$, $M_{3D}''$, while p-mos transistor $M_{3D}''$ has a drain connected to the drains of p-mos transistor M2F and n-mos transistor M1F.

Each of p-mos transistors M3A", M3B" which make up third current mirror circuit 110' has a source connected to the power supply, and a gate connected to the drains of p-mos transistor $M_{2B}$ and n-mos transistor M1B. P-mos transistor M3B" has a drain connected to a gate of each p-mos transistor M3A", M3B", while p-mos transistor M3A" has a drain connected to the drains of p-mos transistor $M_{2A}$ and n-mos transistor M1A.

This embodiment configured as described above is similar to the second embodiment in that seventh voltage/current converting element 107' is provided at an input of first current mirror circuit 108 to supply the input of first current mirror circuit 108 with DC voltage $V_c$ not related to a signal, thereby making it possible to cause a current flowing through transistors $M_{2A}$-M2F to be larger than a current flowing through transistors M1A-M1F at all times. As a result, it is possible to solve a problem in which a bias current experiences difficulties in flowing into transistors $M_{3A}$-$M_{3D}$ which make up second current mirror circuit 109' and third current mirror circuit 110', and to process a differential signal over a full wave rather than half wave, making it less likely to produce a loss in the signal.

Ninth Embodiment

Figure 28:
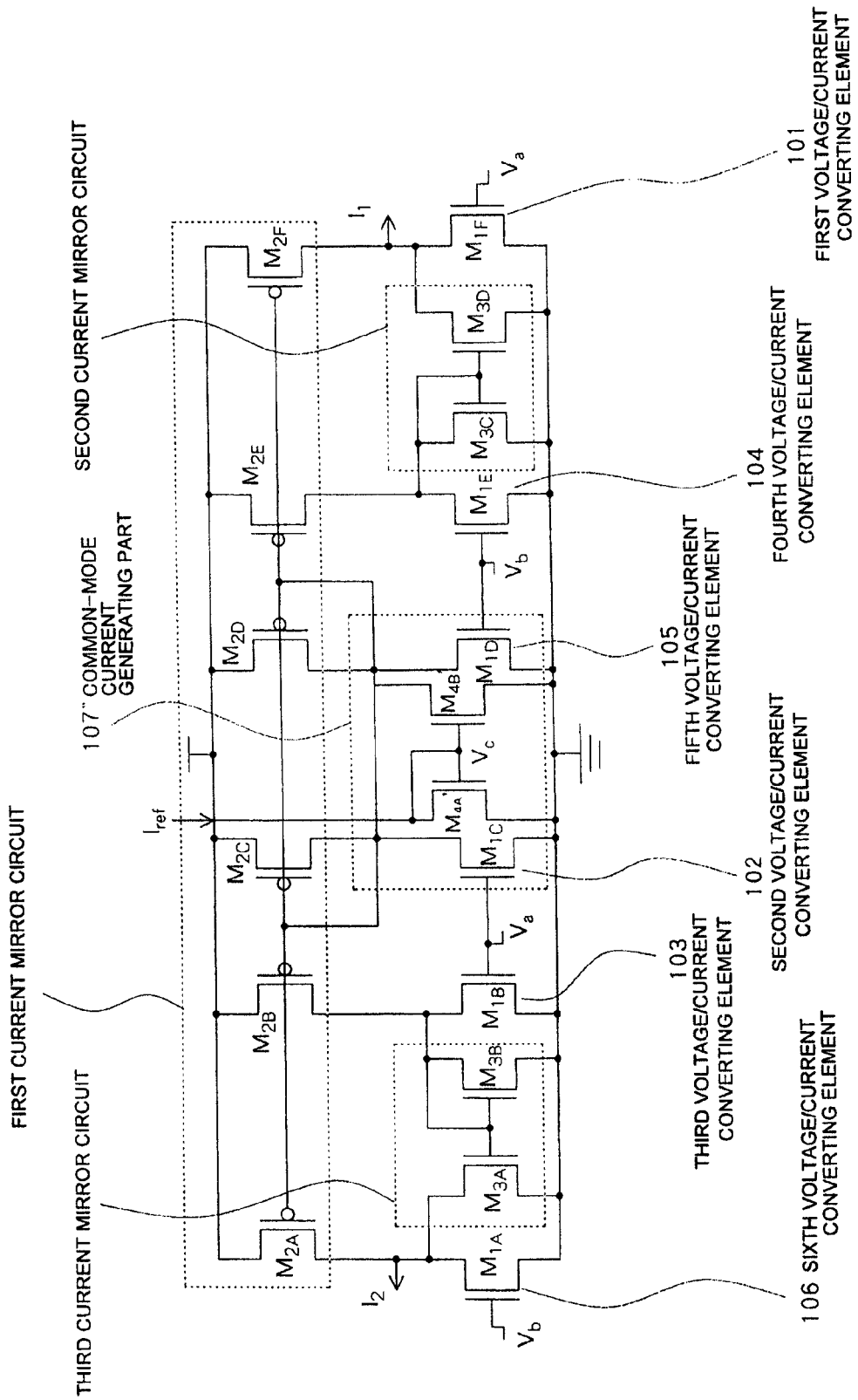
[FIG. 28]
A circuit diagram showing the configuration of a ninth embodiment according to the present invention.

FIG. 28 is a circuit diagram showing the configuration of a ninth embodiment according to the present invention.

In this embodiment, common-mode current generating part 107 in the first embodiment shown in FIG. 7 is replaced with common-mode current generating part 107" which comprises a current mirror circuit, thus causing it to have a function as the seventh voltage/current converting element shown in FIG. 9.

Common-mode current generating part 107" is provided with n-mos transistors $M_{4A}'$, $M_{4B}'$ in addition to the configuration of common-mode current generating part 107 shown in FIG. 7. Each of n-mos transistors $M_{4A}'$, $M_{4B}'$ has a source grounded, and a drain and a gate supplied with DC voltage $V_c$ connected to the gates of p-mos transistors $M_{2A}$-$M_{2F}$ in common with the drains of n-mos transistors $M_{1C}$, $M_{1D}'$.

In this embodiment configured in the foregoing manner, by applying reference current $I_{ref}$ into the gates of n-mos transistors $M_{4A}'$, $M_{4B}'$, a current flowing through transistors $M_{2A}$-$M_{2F}$ can be made larger than a current flowing through transistors $M_{1A}$-$M_{1F}$ at all times, as is the case with the second embodiment. As a result, it is possible to solve a problem in which a bias current experiences difficulties in flowing into transistors $M_{3A}$-$M_{3D}$ which make up third current mirror circuit 110, and to process a differential signal over a full wave rather than half wave, making it less likely to produce a loss in the signal.

Among the respective embodiments described above, by combining those embodiments which can be combined, effects in the respective embodiments can be synergistically combined. For example, the configuration for adding a bias current shown in the second, fourth, eighth, and ninth embodiments can be combined with a configuration having current mirror circuits at multiple stages shown in the fifth to seventh embodiments, and moreover, transconductance amplifiers provided thereby can of course be designed in a dual configuration, as shown in the second embodiment. These configurations are also included in the present invention.

Tenth Embodiment

Figure 29A:
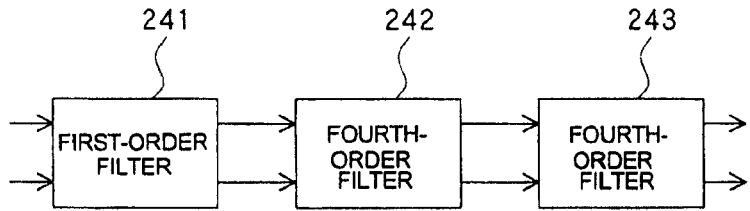
[FIG. 29a]
A diagram showing a tenth embodiment according to the present invention.

FIG. 29 is a diagram showing a tenth embodiment. In this embodiment, the transconductance amplifiers in the first to ninth embodiment are used in filter circuits. As shown in FIG. 29a, in this embodiment, first-order filter 241 is connected in series with fourth-order filters 242, 243.

Figure 29B:
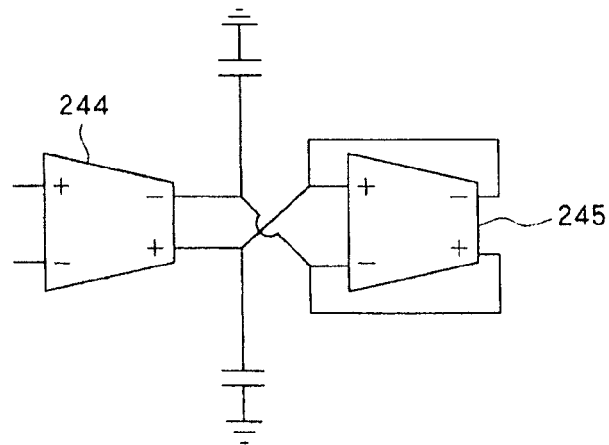
Figure 29C:
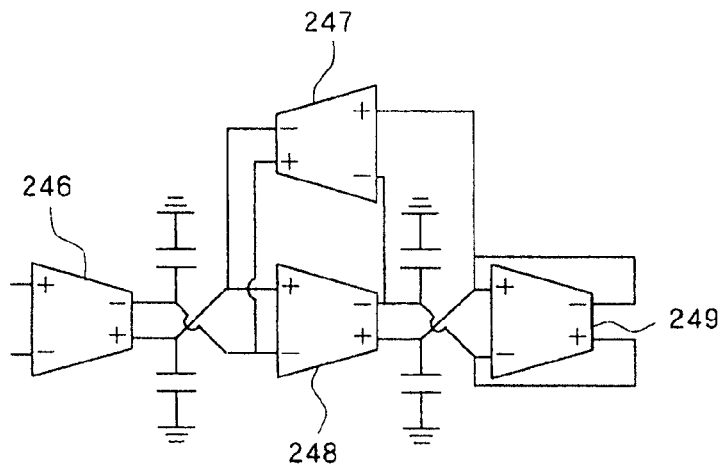

Each filter is a $G_m$-C filter which comprises a transconductance amplifier, in any of the configurations of the first to ninth embodiments, and a capacitance. First-order filter 241 comprises transconductance amplifiers 244, 245 and a capacitance as shown in FIG. 29b, while fourth-order filters 242, 243 each comprise four transconductance amplifiers 246-249 and a capacitance as shown in FIG. 29c.

Transconductance amplifier 244 which forms part of first-order filter 241 has an output terminal and an inverting output terminal connected to an input terminal and an inverting input terminal of transconductance amplifier 245, respectively, and grounded through capacitances as well. Transconductance amplifier 245 in turn has an output terminal and an inverting output terminal connected to the inverting input terminal and input terminal of transconductance amplifier 245, and is thus applied with negative feedback.

Transconductance amplifier 246 which forms part of fourth-order filter 242 or 243 has an output terminal and an inverting output terminal connected to an input terminal and an inverting input terminal of transconductance amplifier 248, respectively, and grounded through capacitances as well. Transconductance amplifier 248 has an output terminal and an inverting output terminal connected to an input terminal and an inverting input terminal of transconductance amplifier 249, respectively, and grounded through capacitances as well. Transconductance amplifier 249 has an output terminal and an inverting output terminal connected to the inverting input terminal and input terminal of transconductance amplifier 249, and is thus applied with negative feedback. Transconductance amplifier 247 has an input terminal and an inverting input terminal connected to the output terminal and inverting output terminal of transconductance amplifier 248, and transconductance amplifier 247 has an output terminal and an inverting output terminal connected to the inverting input terminal and input terminal of transconductance amplifier 248.

By configuring first-order filter 241 and fourth-order filters 242, 243 using the transconductance amplifiers of the first to ninth embodiments and the capacitances, the filters can be configured with reduced common-mode components in signals which appear at their output terminals. Also, it is not essential to combine first-order filter 241 with fourth-order filters 242, 243, but they may be used as discrete filters, as a matter of course.

Eleventh Embodiment

FIG. 30 is a diagram showing an eleventh embodiment. In this embodiment, a Gm-C type current controlled oscillator is configured using the transconductance amplifier of the ninth embodiment, and is applied to a frequency control loop to configure a PLL circuit.

Figure 30A:
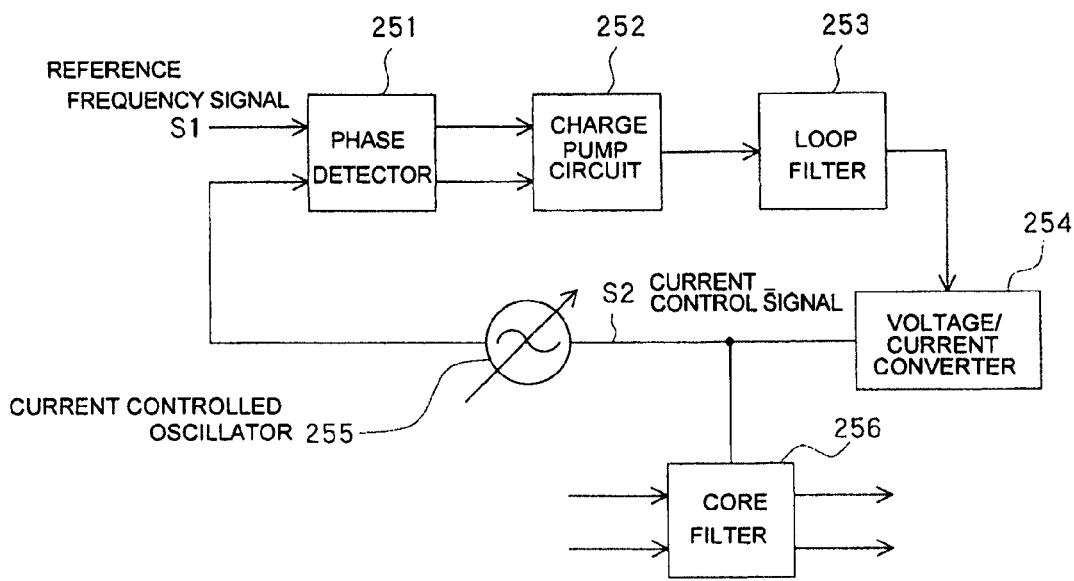
[FIG. 30a]
A block diagram showing the circuit configuration of a PLL of an eleventh embodiment according to the present invention.

FIG. 30a shows the configuration of a PLL circuit which uses a frequency control loop. The PLL circuit of this embodiment comprises phase detector 251, charge pump circuit 252, loop filter 253, voltage/current converter 254, current controlled oscillator 255, and core filter 256.

Phase detector 251 receives reference frequency signal S1 from the outside and current controlled oscillator 255 to generate a signal in accordance with a phase difference therebetween. An output signal of phase detector 251 is amplified by charge pump circuit 252, converted to a current in voltage/current converter 254 after high frequency components thereof are removed by loop filter 253, and supplied to current controlled oscillator 255 and core filter 256 as current control signal S2.

Current controlled oscillator 255 has its oscillation frequency controlled in accordance with the value of current control signal S2, while core filter 256 changes a frequency response characteristic in accordance with the value of current control signal S2.

Figure 30B:
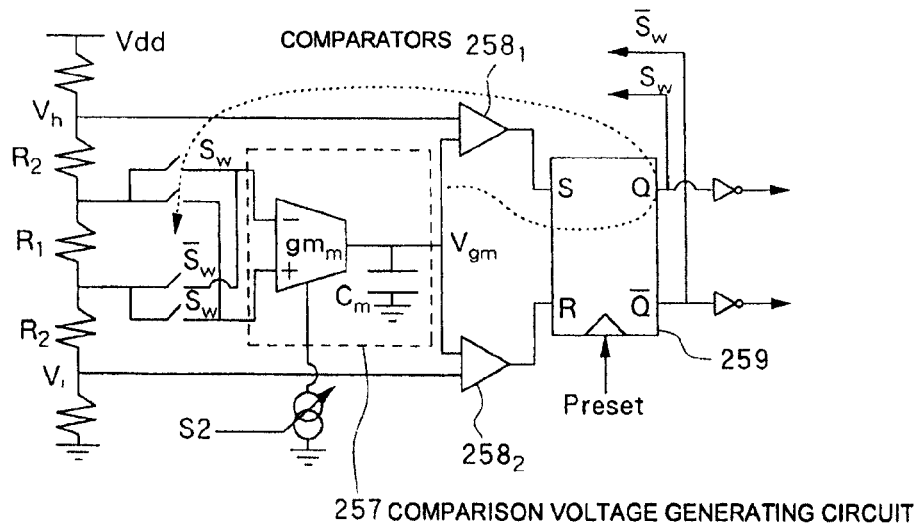

FIG. 30b is a circuit diagram showing the configuration of current controlled oscillator 255.

Current controlled oscillator 255 shown in FIG. 30b comprises comparison voltage generating circuit 257, comparators $258_1$, $258_2$, RS flip-flop 259, resistors $R_2, R_1, R_2$ provided between a power supply and a ground, and a switch, whose open/close state is controlled by RS flip-flop 259, for selectively supplying comparison voltage generating circuit 257 with a voltage divided by each resistor. The comparison voltage generating circuit is made up of transconductance amplifier $gm_m$ and capacitance $C_m$.

Comparators $258_1$, $258_2$, provided in front of RF flip-flop 259, compare output voltage $V_{gm}$ of comparison voltage generating circuit 257 with $V_h$ and $V_l$, and switch the stage of RS flip-flop 259 in accordance with the result. RS flip-flop 259 is set and reset to cause a change in its output, to change an input voltage to comparison voltage generating circuit 257, charging and discharging capacitance $C_m$ to cause a change in output voltage $V_{gm}$ of comparison voltage generating circuit 257. This operation is repeated every half period of the oscillation frequency of current controlled oscillator 255, and the output of RS flip-flop 259 is supplied to phase detector 251 as the output of current controlled oscillator 255.

Oscillation frequency $t_{OSC}$ of current controlled oscillator 255 is estimated by:

$$t_{OSC}=2\times(1/(gm_u/C_m)\times(R_1/(R_1+2\times R_2))+t_d)$$

where $gm_u$ represents mutual conductance of transconductance amplifier $gm_m$, and $t_d$ represents a delay on a switching path indicated by the broken arrow in FIG. 30b. Oscillation frequency $t_{OSC}$ of current controlled oscillator 255 is dominated by the ratio $gm_u/C_m$ of the mutual transconductance to the capacitance, and by delay $t_d$ on the switching path. The ratio of the resistances $_1/(R_1+2\times R_2)$ determines the ratio of input and output voltages to comparison voltage generating circuit 257, and does not directly relate to oscillation frequency $t_{OSC}$ of current controlled oscillator 255. Stated another way, current controlled oscillator 255 will never be affected by processing steps, temperature, or supplied voltage. This means that an adjusted oscillation accuracy is ideal.

Figure 30C:
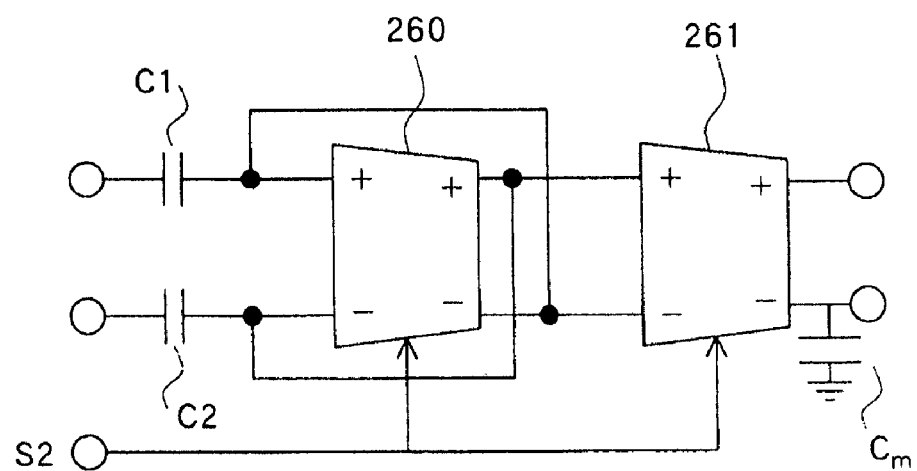
[FIG. 30c]
A circuit diagram specifically showing the configuration of a comparison voltage generating circuit 257 shown in FIG. 30b.

FIG. 30c is a circuit diagram specifically showing the configuration of comparison voltage generating circuit 257 shown in FIG. 30b.

Comparison voltage generating circuit 257 is made up of transconductance amplifiers 260, 261 which comprises transconductance amplifier $gm_m$, and capacitance $C_m$. Transconductance amplifier 260 has an output terminal and an inverting output terminal connected to an input terminal and an inverting input terminal of transconductance amplifier 261, and also connected to an inverting input terminal and an input terminal of transconductance amplifier 260 and is thus applied with a negative feedback. Transconductance amplifier 260 has the input terminal and inverting input terminal connected to an input terminal of comparison voltage generating circuit 257 through capacitances C1, C2, respectively, and an output terminal and an inverting output terminal of transconductance amplifier 261 are respectively used as output terminals of comparison voltage generating circuit 257.

Each of transconductance amplifiers 260, 261 is the transconductance amplifier according to the ninth embodiment, and is supplied with current control signal S2 to control signal input terminal s current $I_{ref}$. By connecting transconductance amplifier 260 to apply the same with a negative feedback in the foregoing manner, a current flowing through an output stage is controlled in accordance with the value of current control signal S2 to control a signal bias at the output.

As a result of controlling the signal bias, the mutual conductance changes to cause a change in $gm_u/C_m$ which is the ratio of the mutual conductance to the capacitance, dominating oscillation frequency $t_{OSC}$ of current controlled oscillator 255, resulting in a change in oscillation frequency $t_{OSC}$ of current controlled oscillator 255.

While this embodiment has been described on the assumption that the transconductance amplifiers shown in the ninth embodiment are used as transconductance amplifiers 260, 261, the transconductance amplifiers shown in the second embodiment, fourth embodiment, and eighth embodiment can be used as well. By connecting these transconductance amplifiers likewise so as to apply a negative feedback thereto, a current flowing through the output stage is controlled in accordance with voltage $V_c$, causing a change in the mutual conductance. By converting current control signal S2 to a voltage through a resistor, and by supplying voltage $V_c$, a signal bias generating circuit, a current controlled oscillator, and a PLL circuit can be configured in a manner similar to this embodiment.

Further, the circuit characteristics are improved by using transconductance amplifiers which exhibit the same characteristics for transconductance amplifiers 260, 261, but it is not essential to design the transconductance amplifiers shown in the second, fourth, eighth, and ninth embodiments. Transconductance amplifier 260 is provided for the purpose of setting an input bias, and a similar circuit operation can be performed, for example, by providing a capacitance between outputs of transconductance amplifier 260. In configuring transconductance amplifier $gm_m$ in this embodiment, the importance to recognize that the transconductance amplifier, shown in the second, fourth, eighth, ninth embodiment, is used as transconductance amplifier 260 which is connected so that it can be applied with a negative feedback to control current flowing through the output stage in accordance with the value of current control signal S2, such that the signal bias of the output is controlled.

Twelfth Embodiment

Figure 31:
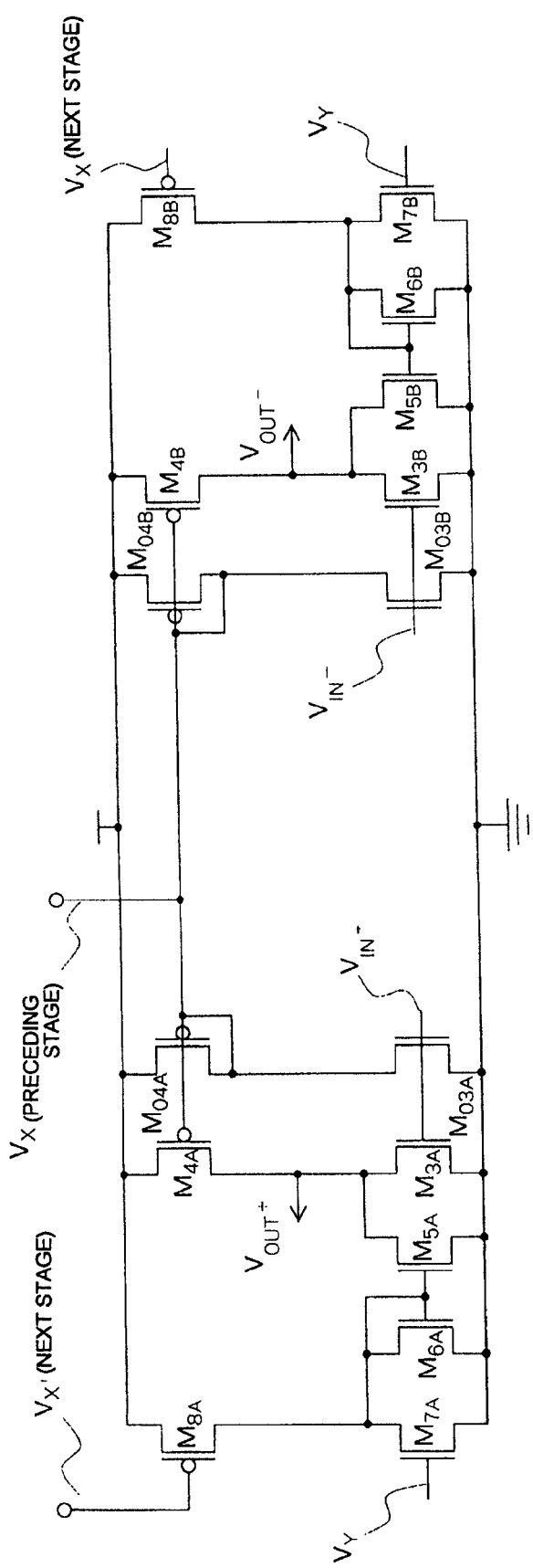
[FIG. 31]
A circuit diagram showing the configuration of a twelfth embodiment of the present invention.

FIG. 31 is a circuit diagram showing the configuration of a twelfth embodiment according to the present invention.

This embodiment is made up of n-mos transistors $M_{03A}$, $M_{3A}$, $M_{5A}$, $M_{6A}$, $M_{7A}$, $M_{03B}$, $M_{3B}$, $M_{5B}$, $M_{6B}$, $M_{7B}$, and p-mos transistors $M_{04A}$, $M_{4A}$, $M_{8A}$, $M_{04}$, $M_{4B}$, $M_{8B}$.

P-mos transistors $M_{4A}$, $M_{04A}$, $M_{04B}$, $M_{04B}$ correspond to n-mos transistors $M_{3A}$, $M_{03A}$, $M_{03B}$, $M_{3B}$, respectively, where these corresponding transistors are provided between a power supply and a ground with their drains being in common. P-mos transistors $M_{4A}$, $M_{04A}$, $M_{04B}$, $M_{04B}$ have their gates connected to the drains of p-mos transistors $M_{04A}$, $M_{04B}$ to configure a current mirror circuit. N-mos transistors $M_{3A}$, $M_{03A}$ have their gates connected commonly to gate of $M_{03B}$, $M_{3B}$ to configure an OTA similar to the OTA shown in FIG. 1a.

Source-grounded n-mos transistors $M_{5A}$, $M_{6A}$, $M_{5B}$, $M_{6B}$ respectively form part of a current mirror circuit, where transistors $M_{5A}$, $M_{6A}$ have their gates connected commonly to a drain of transistor $M_{6A}$, while transistors $M_{5B}$, $M_{6B}$ have their gates connected commonly to a drain of transistor $M_{6B}$. Transistor $M_{5A}$ has a drain connected to the drains of transistors $M_{3A}$, $M_{4A}$ which serve as an output node of $V_{OUT}+$ of the OTA, while transistor $M_{5B}$ has a drain connected to the drains of transistors $M_{3B}$, $M_{4B}$ which serve as an output node of $V_{out}-$ of the OTA.

Transistors $M_{7A}$, $M_{7B}$, $M_{8A}$, $M_{8B}$ form part of a CMFB circuit, where transistor $M_{7A}$ supplied with reference signal $V_Y$ at a gate has a grounded source, and transistor $M_{8A}$ having a gate used as node $V_X$ (next stage) which is a feedback signal input terminal, has a source connected to the power supply. Transistors $M_{7A}$, $M_{8A}$ have their drains connected to the gates of n-mos transistors $M_{5A}$, $M_{6A}$ and to a drain of transistor $M_{6A}$ to supply a reference current of a current mirror circuit which is made up of transistors $M_{5A}$, $M_{6A}$.

Transistor $M_{7B}$ supplied with reference signal $V_Y$ at a gate has a grounded source, and transistor $M_{8B}$ having a gate used as node $V_X$ (next stage), has a source connected to the power supply. Transistors $M_{7B}$, $M_{8B}$ have their drains connected to the gates of n-mos transistors $M_{5B}$, $M_{6B}$ and to a drain of transistor $M_{6B}$ to supply a reference signal to a current mirror circuit which is made up of transistors $M_{5B}$, $M_{6B}$.

Figure 1:
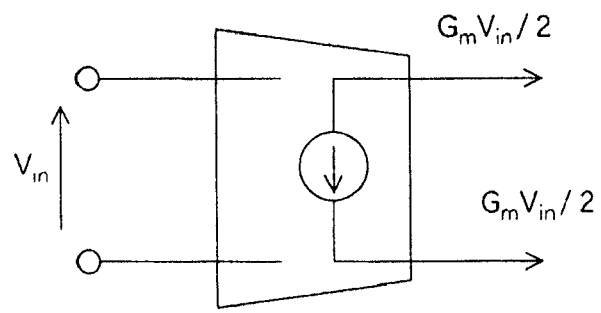
[FIG. 1]
A diagram showing the basic configuration of a transconductance amplifier.

In the circuit configured as described above, the operation in an OTA portion is similar to the operation which has been described with reference to FIG. 1a.

Figure 2:
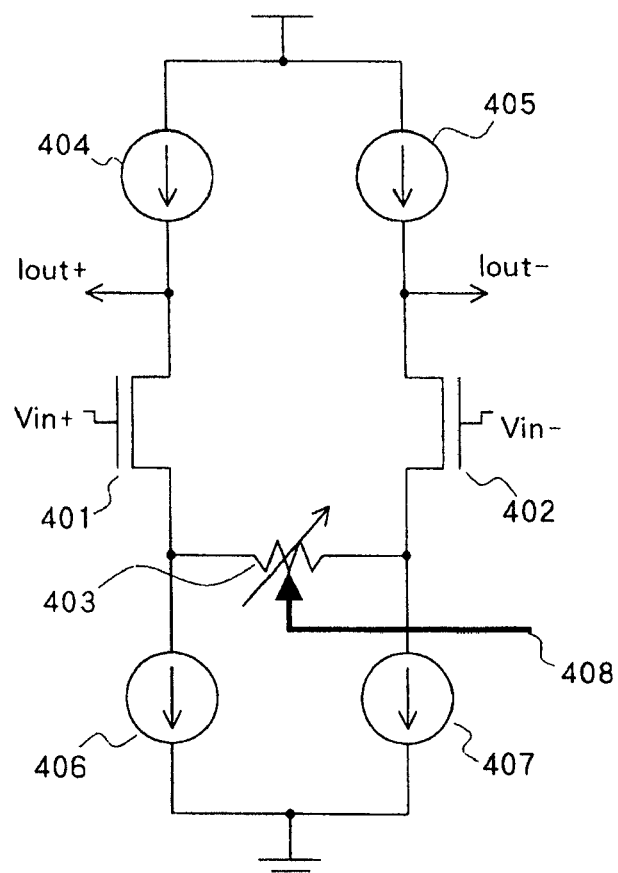
[FIG. 2]
A circuit diagram showing a specific configuration of a degenerated differential OTA which is an OTA, whose mutual conductance $G_m$ of which is controlled.

A description will be given of the operation of the circuit of this embodiment which is connected as shown in FIG. 2c to increase common-mode voltages of $V_{IN}+$, $V_{IN}-$ supplied from the OTA at the preceding stage.

As gate voltages of transistors $M_{03A}$, $M_{03B}$ increase due to an increase in common-mode components of $V_{IN}+$, $V_{IN}-$ supplied from the OTA at the preceding stage, drain currents of transistors $M_{3A}$, $M_{3B}$ increase, while voltage decreases at node $V_X$ (preceding stage), which is a feedback signal output terminal. Since node $V_X$ (preceding stage) is connected to node $V_X$ (next stage) of the OTA disposed at the preceding stage, gate voltages decrease in transistor $M_{8A}$, $M_{8B}$ of the OTA at the preceding stage, while drain currents of transistors $M_{8A}$, $M_{8B}$ increase. In this event, the difference between a current which flows through transistors $M_{7A}$, $M_{7B}$, whose drain current is determined at a predetermined value by reference signal $V_Y$, and a current which flows through transistors $M_{8A}$, $M_{8B}$, flows into transistors $M_{6A}$, $M_{6B}$ to increase the current which flows into transistors $M_{6A}$, $M_{6B}$. Since transistors $M_{6A}$, $M_{6B}$ form part of a current mirror circuit together with transistors $M_{5A}$, $M_{5B}$, a current flowing through transistors $M_{5A}$, $M_{5B}$ also increases to the accompaniment of an increase in the current which flows through transistors $M_{6A}$, $M_{6B}$. As the current which flows through transistors $M_{5A}$, $M_{5B}$ increases, the voltages of $V_{OUT}+$, $V_{OUT}-$ decrease. Since $V_{OUT}+$ and $V_{OUT}-$ of the OTA at the preceding stage are $V_{IN}+$, $V_{IN}-$ of the OTA at the next stage, a feedback circuit is configured.

In this embodiment configured as described above, the drains of transistors $M_{3A}$, $M_{4A}$, $M_{5A}$ or the drains of transistors $M_{3B}$, $M_{4B}$, $M_{5B}$ are connected to each output node of the OTA, and three transistors are connected to the output node. As a result, the connected quantity is reduced from before to reduce output conductance and parasitic capacitance caused by each transistor connected in parallel, thus making it possible to prevent a reduction in output impedance of the OTA, and a degradation in characteristics as the OTA.

Thirteenth Embodiment

Figure 32:
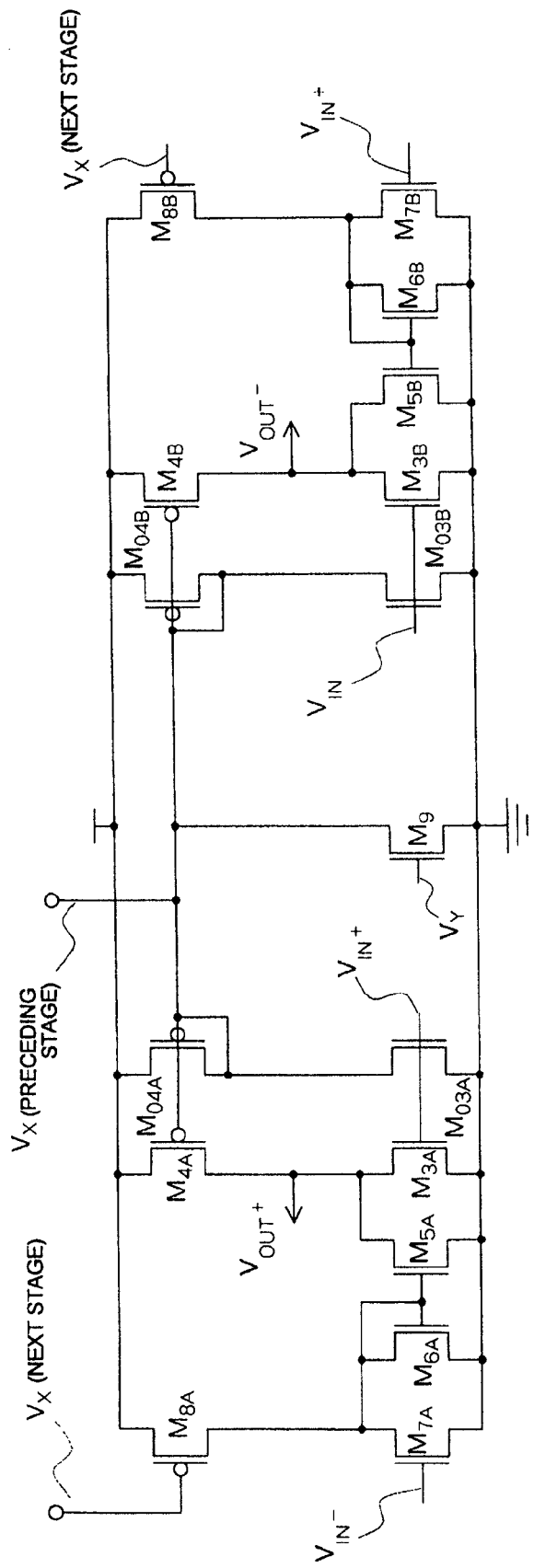
[FIG. 32]
A circuit diagram showing the configuration of a thirteenth embodiment of the present invention.

FIG. 32 is a circuit diagram showing the configuration of a thirteenth embodiment according to the present invention.

In this embodiment, n-mos transistor M9 supplied with reference signal $V_Y$ at a gate is provided between each gate of p-mos transistors $M_{4A}$, $M_{04A}$, $M_{04B}$, $M_{4B}$ and a ground in the circuit of the twelfth embodiment shown in FIG. 31, to supply $V_{IN}+$, $V_{IN}-$ to the sources of transistors $M_{7A}$, $M_{7B}$ which are supplied with reference signal $V_Y$ in the first embodiment.

In this embodiment configured as described above, an common-mode bias of outputs $V_{OUT}+$, $V_{OUT}-$ is determined to a predetermined bias by n-mos transistor M9. Also, as common-mode components of $V_{IN}+$, $V_{IN}-$ supplied from the OTA at the preceding stage increase to increase the gate voltages of transistors $M_{03A}$, $M_{03B}$, the drain currents of transistors $M_{03A}$, $M_{03B}$ increase, while a voltage at node $V_X$ (preceding stage) decreases. Since node $V_X$ (preceding stage) is connected to node $V_X$ (next stage) of the OTA disposed at the preceding stage, the gate voltages of transistors $M_{8A}$, $M_{8B}$ decrease in the OTA at the preceding stage, while the drain currents of transistors $M_{8A}$, $M_{8B}$ increase. In this event, a current flowing into transistors $M_{6A}$, $M_{6B}$ further increases due to an increase in the gate voltage of transistors $M_{7A}$, $M_{7B}$ which are supplied with $V_{IN}+$, $V_{IN}-$ at the gates, where the amount of current amounts to approximately twice as much as the twelfth embodiment. Since transistors $M_{6A}$, $M_{6B}$ form part of a current mirror circuit together with transistors $M_{5A}$, $M_{5B}$, a current flowing through transistors $M_{5A}$, $M_{5B}$ also increases to the accompaniment of an increase in the current which flows through transistors $M_{6A}$, $M_{6B}$. As the current flowing through transistors $M_{5A}$, $M_{5B}$ increases, the voltages of $V_{OUT}+$ and $V_{OUT}-$ decrease.

In this embodiment configured as described above, three transistors are connected to each output node of the OTA, making it possible to prevent a reduction in output impedance of the OTA and a degradation in the characteristics as the OTA, as is the case with the twelfth embodiment. Further, the signal amplitude of a response component in $V_{OUT}+$, $V_{OUT}-$ to a change in common-mode components of $V_{IN}+$, $V_{IN}-$ increases to approximately twice as much as the twelfth embodiment, thus improving the feedback response speed.

Fourteenth Embodiment

Figure 33:
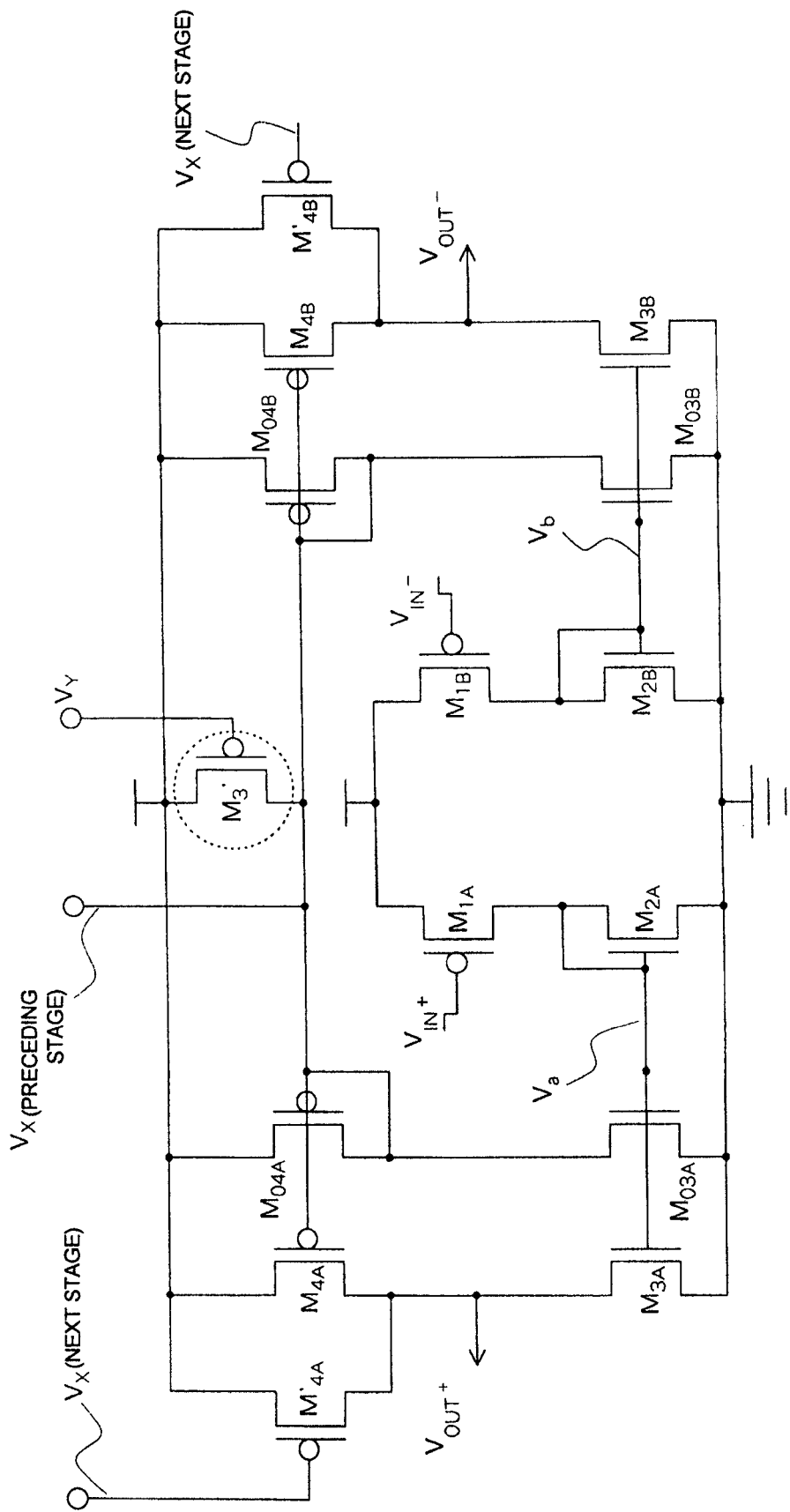
[FIG. 33]
A circuit diagram showing the configuration of a fourteenth embodiment of the present invention.

FIG. 33 is a circuit diagram showing the configuration of a fourteenth embodiment according to the present invention.

In this embodiment, p-mos transistor M3' supplied with reference signal $V_Y$ at a gate is provided between each gate of p-mos transistors $M_{4A}$, $M_{04A}$, $M_{04B}$, $M_{04B}$ and the power supply in the circuit shown in FIG. 2B, and transistors $M_{3A}'$, $M_{3B}'$ supplied with reference voltage $V_Y$ are removed in the circuit shown in FIG. 2b.

In this embodiment configured as described above, an common-mode bias of outputs $V_{OUT}+$, $V_{OUT}-$ is set to a predetermined bias by p-mos transistor M3'. In this way, three transistors are connected to each output node of the OTA, as is the case with the twelfth and thirteenth embodiments, making it possible to prevent a reduction in the output impedance of the OTA and a degradation in the characteristics as the OTA.

While each embodiment has been described on the assumption that the transistors which make up circuits comprise p-mos transistors and n-mos transistors, the circuits may be made up of JFETs and bipolar transistors. Also, p-mos transistors may be replaced with n-mos transistors, and n-mos transistors may be replaced with p-mos transistors.

Alternatively, a well separation type, which is effective in reducing noise, can be used for the n-mos transistors.

Fifteenth Embodiment

Figure 34A:
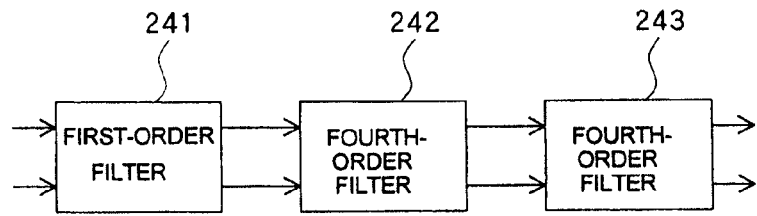
[FIG. 34a]
A block diagram showing the configuration of a filter of a fifteenth embodiment according to the present invention.

FIG. 34 is a diagram showing a fifteenth embodiment. In this embodiment, the transconductance amplifiers of the twelfth to fourteenth embodiments are used in filter circuits. As shown in FIG. 34a, this embodiment comprises first-order filter 241 connected in series with fourth-order filters 242, 243.

Figure 34B:
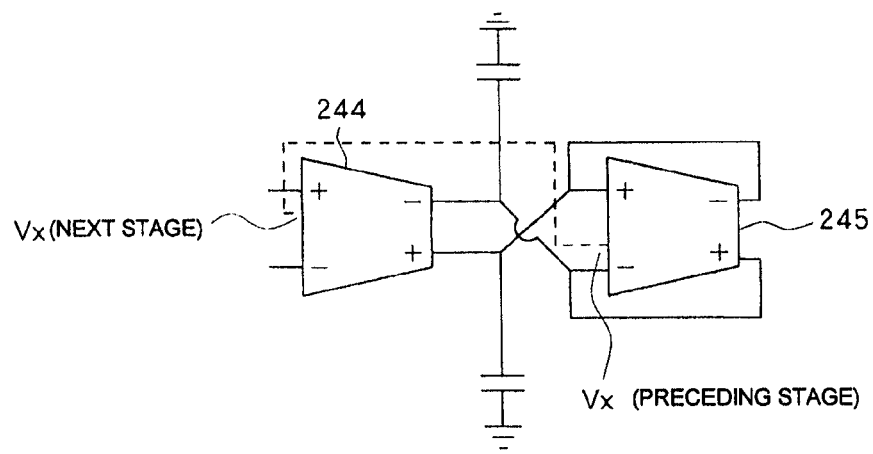
Figure 34C:
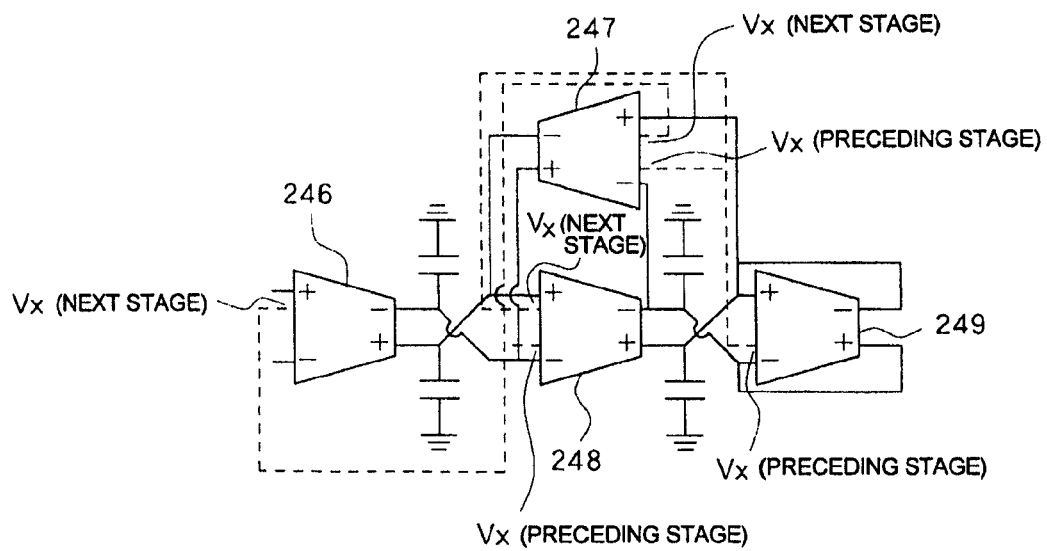

Each filter is a $G_m$-C filter which comprises which comprises a transconductance amplifier, in any of the configurations of the twelfth to fourteenth embodiments, and a capacitance. First-order filter 241 comprises transconductance amplifiers 244, 245 and a capacitance as shown in FIG. 34b, while fourth-order filters 242, 243 each comprise four transconductance amplifiers 246-249 and a capacitance as shown in FIG. 34c.

Transconductance amplifier 244 which forms part of first-order filter 241 has an output terminal and an inverting output terminal connected to an input terminal and an inverting input terminal of transconductance amplifier 245, respectively, and is grounded through capacitances as well. Transconductance amplifier 245 in turn has an output terminal and an inverting output terminal connected to the inverting input terminal and input terminal of transconductance amplifier 245, and is thus applied with negative feedback. Also, $V_X$ (preceding stage) of transconductance amplifier 245 is connected to $V_X$ (next stage) of transconductance amplifier 244.

Transconductance amplifier 246 which forms part of fourth-order filter 242 or 243 has an output terminal and an inverting output terminal connected to an input terminal and an inverting input terminal of transconductance amplifier 248, respectively, and is grounded through capacitances as well. Transconductance amplifier 248 has an output terminal and an inverting output terminal connected to an input terminal and an inverting input terminal of transconductance amplifier 249, respectively, and is grounded through capacitances as well. Transconductance amplifier 249 has an output terminal and an inverting output terminal connected to the inverting input terminal and input terminal of transconductance amplifier 249, and is thus applied with negative feedback. Transconductance amplifier 247 has an input terminal and an inverting input terminal connected to the output terminal and inverting output terminal of transconductance amplifier 248, and transconductance amplifier 247 has an output terminal and an inverting output terminal connected to the inverting input terminal and input terminal of transconductance amplifier 248. Also, the $V_X$ (preceding stage) of transconductance amplifier 248 is connected to the $V_X$ (next stage) of transconductance amplifiers 246, 247, and the $V_X$ (next stage) of transconductance amplifier 248 is connected to the $V_X$ (preceding stage) of transconductance amplifiers 248, 249.

By configuring first-order filter 241 and fourth-order filters 242, 243 using the transconductance amplifiers of the first to third embodiments and capacitances, the filters can be configured with the common-mode bias being set at a predetermined value such that there is limited degradation in characteristics. Also, it is not essential to combine first-order filter 241 with fourth-order filters 242, 243, but they may be used as discrete filters, as a matter of course.

Sixteenth Embodiment

FIG. 35 is a diagram showing a sixteenth embodiment. In this embodiment, a Gm-C type current controlled oscillator is configured using the transconductance amplifier of the twelfth to fourteenth embodiments, and is applied to a frequency control loop to configure a PLL circuit.

Figure 35A:
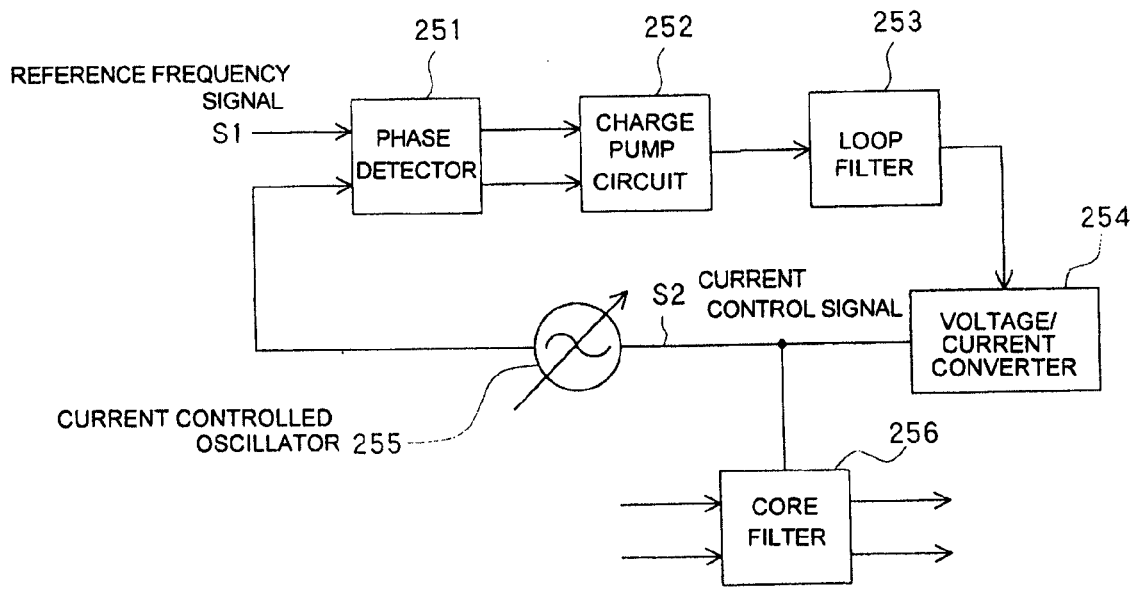
[FIG. 35a]
A block diagram showing the circuit configuration of a pLL of a sixteenth embodiment according to the present invention.

FIG. 35a shows the configuration of a PLL circuit which uses a frequency control loop. The PLL circuit of this embodiment comprises phase detector 251, charge pump circuit 252, loop filter 253, voltage/current converter 254, current controlled oscillator 255, and core filter 256.

Phase detector 251 receives reference frequency signal S1 from the outside and current controlled oscillator 255 to generate a signal in accordance with a phase difference therebetween. The output signal of phase detector 251 is amplified by charge pump circuit 252, converted to a current in voltage/current converter 254 after high frequency components thereof are removed by loop filter 253, and is supplied to current controlled oscillator 255 and core filter 256 as current control signal S2.

Current controlled oscillator 255 has its oscillation frequency controlled in accordance with the value of current control signal S2, while core filter 256 changes the frequency response characteristics in accordance with the value of current control signal S2.

Figure 35B:
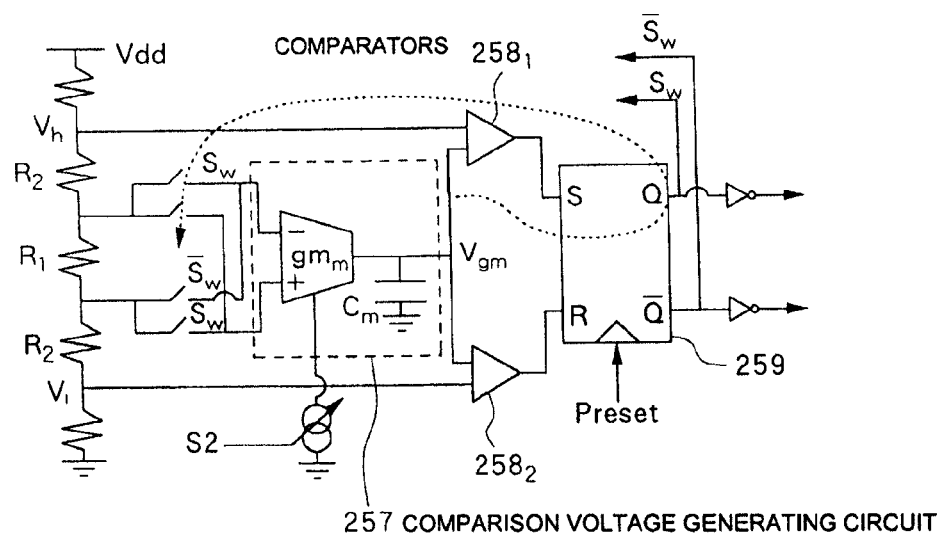

FIG. 35b is a circuit diagram showing the configuration of current controlled oscillator 255.

Current controlled oscillator 255 shown in FIG. 35b comprises comparison voltage generating circuit 257, comparators $258_1$, $258_2$, RS flip-flop 259, resistors $R_2$, $R_1$, $R_2$ provided between a power supply and a ground, and a switch whose open/close state of which is controlled by RS flip-flop 259, for selectively supplying comparison voltage generating circuit 257 with a voltage divided by each resistor. Comparison voltage generating circuit 257 is made up of transconductance amplifier $gm_m$ and capacitance $C_m$.

Comparators $258_1$, $258_2$, provided in front of RF flip-flop 259, compare output voltage $V_{gm}$ of comparison voltage generating circuit 257 with $V_h$ and $V_l$, and switch the stage of RS flip-flop 259 in accordance with the result. RS flip-flop 259 is set and reset to cause a change in its output, to change an input voltage to signal generating bias circuit 257, charging and discharging capacitance $C_m$ to cause a change in output voltage $V_{gm}$ of comparison voltage generating circuit 257. This operation is repeated every half period of the oscillation frequency of current controlled oscillator 255, and the output of RS flip-flop 259 is supplied to phase detector 251 as the output of current controlled oscillator 255.

Oscillation frequency $t_{OSC}$ of current controlled oscillator 255 is estimated by:

$$t_{OSC} = 2 \times (1/(gm_u/C_m) \times (R_1/(R_1 + 2 \times R_2)) + t_d)$$

where $gm_u$ represents mutual conductance of transconductance amplifier $gm_m$, and $t_d$ represents a delay on a switching path indicated by the broken arrow in FIG. 35b. Oscillation frequency $t_{OSC}$ of current controlled oscillator 255 is dominated by the ratio $gm_u/C_m$ of the mutual transconductance to the capacitance, and by delay $t_d$ on the switching path. The ratio of the resistances $R_1/(R_1+2\times R_2)$ determines the ratio of input and output voltages to comparison voltage generating circuit 257, and does not directly relate to oscillation frequency $t_{OSC}$ of current controlled oscillator 255. Stated another way, current controlled oscillator 255 will never be affected by processing steps, temperature, or supplied voltage. This means that an adjusted oscillation accuracy is ideal.

In this embodiment, the transconductance amplifier of the first to third embodiments is used for comparison voltage generating circuit 257, and current control signal S2 is converted to a voltage by a resistor (not shown) and supplied to $V_X$ (next stage) which is a feedback signal input terminal. By applying a negative feedback as described above, a current flowing through the output stage is controlled in accordance with the value of current control signal S2 to control the common-mode bias of the output. As a result of controlling the common-mode bias, the mutual conductance changes to cause a change in $gm_u/C_m$ which is the ratio of the mutual conductance to the capacitance, dominating oscillation frequency $t_{OSC}$ of current controlled oscillator 255, resulting in a change in oscillation frequency $t_{OSC}$ of current controlled oscillator 255.

The invention claimed is:

1. A voltage-to-current converting method for generating a first current and a second current proportional to a difference between an input first voltage signal and second voltage signal, characterized by comprising the steps of:
   converting the first voltage signal to a first current signal;
   converting the second voltage signal to a second current signal;
   generating an common-mode component of the first current signal and the second current signal;
   generating a third current signal and a fourth current signal by subtracting the common-mode component from the first current signal and the second current signal, respectively, generating a first output by subtracting the fourth current signal from the third current signal, and generating a second output by subtracting the third current signal from the fourth current signal.

2. A transconductance amplifier characterized by comprising:
   a first and a second voltage/current converting element for converting a first voltage signal to a current signal;
   a third and a fourth voltage/current converting element for converting a second voltage signal to a current signal;
   an common-mode current generating part for converting each first voltage signals and each second voltage signal to a current signal, and further generating an common-mode current in accordance with an common-mode component of each current signal;
   a first current circuit for subtracting the common-mode component by using said common-mode component generating part from each current signal converted by each of said first to fourth voltage/current converting elements;
   a second current circuit for supplying a difference between a current signal by using said first voltage/current converting element from which the common-mode component is subtracted by using said first current circuit and a current signal by using said third voltage/current converting element as a first current output; and
   a third current circuit for supplying a difference between a current signal by using said fourth voltage/current converting element from which the common-mode component is subtracted by using said first current circuit and a current signal by using said second voltage/current converting element as a second current output.

3. The transconductance amplifier according to claim 2, characterized in that said common-mode current generating part comprises a fifth voltage/current converting element and a sixth voltage/current converting element for converting the first voltage signal and the second voltage signal to current signals, respectively.

4. The transconductance amplifier according to claim 3, characterized in that:
   said first to sixth voltage/current converting elements comprises a first to a sixth first conductivity type transistor supplied with the first voltage signal or the second voltage signal at bases or gates,
   said first current circuit comprises a plurality of second conductivity type transistors, said plurality of second conductivity type transistors have their gates in common, and at least one of said plurality of second conductivity type transistors have a gate short-circuited to a drain, and an output of said second conductivity type transistor is connected to any of the outputs of said first to sixth voltage/current converting elements.

5. The transconductance amplifier according to claim 3, characterized in that:
said first to sixth voltage/current converting elements comprise a first to a sixth first conductivity type transistor supplied with the first voltage signal or the second voltage signal at bases or gates,
said first current circuit comprises a first to a sixth second conductivity type transistor provided between a power supply and a ground together with said first to sixth voltage/current converting elements,
said second conductivity type transistors have their gates and sources in common, and at least one of said second conductivity type transistors has a gate short-circuited to a drain, and
outputs of said second conductivity type transistor are connected to outputs of said first to sixth voltage/current converting elements, respectively.

6. The transconductance amplifier according to claim 5, characterized in that:
said fifth first conductivity type transistor and said sixth first conductivity type transistor are first transistors which have the same size with each other,
said first to fourth first conductivity type transistors are second transistors which have the same size with one another,
said fifth second conductivity type transistor and said sixth second conductivity type transistor are third transistors which have the same size with each other,
said first to fourth second conductivity type transistors are fourth transistors which have the same size with one another, and
the ratio of the size of said first transistor to the size of said second transistor is equal to the ratio of the size of said third transistor to the size of said fourth transistor.

7. The transconductance amplifier according to claim 5, characterized in that:
said first first conductivity type transistor forms part of a first current output supplying part, and said fourth first conductivity type transistor forms part of a second current output supplying part,
said second current circuit comprises a seventh first conductivity type transistor having an output in common with an output of said first first conductivity type transistor, and an eighth first conductivity type transistor having an output and a gate in common with an output of said third first conductivity type transistor and a gate of said seventh first conductivity type transistor,
said third current circuit comprises a ninth first conductivity type transistor having an output in common with an output of said second first conductivity type transistor, and a tenth first conductivity type transistor having an output and a gate in common with an output of said fourth first conductivity type transistor and a gate of said ninth first conductivity type transistor,
said second, third, fifth, and sixth first conductivity type transistors are first transistors which match in size with one another,
said first first conductivity type transistor and said fourth first conductivity type transistor are second transistors which have the same size with each other,
said eighth first conductivity type transistor and said tenth first conductivity type transistor are third transistors which have the same size with each other,
said seventh first conductivity type transistor and said ninth first conductivity type transistor are fourth transistors which have the same size with each other,
said fifth second conductivity type transistor, said sixth second conductivity type transistor, said second second conductivity type transistor, and said third second conductivity type transistor are fifth transistors which have the same size with one another,
said first second conductivity type transistor and said fourth second conductivity type transistor are sixth transistors which have the same size with each other, and
the ratio of the size of said first transistor to the size of said second transistor, the ratio of the size of said third transistor to the size of said fourth transistor, and the ratio of the size of said fifth transistor to the size of said sixth transistor are equal.

8. The transconductance amplifier according to claim 3, characterized in that:
said first current circuit comprises a plurality of sets of said first to sixth second conductivity type transistors, wherein second conductivity type transistors in other sets are configured such that outputs of said second conductivity type transistors are connected to inputs of said second conductive type transistors.

9. The transconductance amplifier according to claim 3, characterized in that:
said transconductance amplifier comprises a plurality of sets of the first to fourth first conductivity type transistors making up said second current circuit and third current circuits, wherein the first conductivity type transistors in other sets are connected to outputs of said second conductivity type transistors and to inputs of said second conductivity type transistors.

10. A transconductance amplifier characterized by comprising:
a plurality of transconductance amplifiers according to claim 2;
a fourth current circuit provided in one transconductance amplifier for generating a difference between a first current output and a second current output in said one transconductance amplifier as a first current output; and
a fifth current circuit provided in another transconductance amplifier for generating a difference between a second current output and a first current output in the other transconductance amplifier as a second current output.

11. The transconductance amplifier according to claim 3, characterized in that:
said common-mode current generating part comprises a seventh voltage/current converting element supplied with a third voltage signal at a base or a gate, and generates an common-mode current including a bias current in accordance with the third voltage signal as the common-mode current.

12. The transconductance amplifier according to claim 3, characterized by comprising:
a first bias current generating element for generating a first bias current added to a reference current supplied by said first current circuit to said second current circuit; and
a second bias current generating element for generating a second bias current added to a reference current supplied by said first current circuit to said third current circuit.

13. A first-order filter circuit configured using the transconductance amplifiers according to claim 2, wherein:
said filter circuit comprises said transconductance amplifier and a capacitance, and is made up of a first and a second transconductance amplifier, said first transconductance amplifier having an output terminal and an inverting output terminal connected to an input terminal and an inverting input terminal of said second transconductance amplifier, respectively, and grounded through capacitances, said second transconductance amplifier having an output terminal and an inverting output terminal connected to the inverting input terminal and input terminal of said second transconductance amplifier.

14. A fourth-order filter circuit configured using the transconductance amplifiers according to claim 2, wherein:
said filter circuit comprises a first to a fourth transconductance amplifier, said first transconductance amplifier having an output terminal and an inverting output terminal connected to an input terminal and an inverting input terminal of said second transconductance amplifier and grounded through capacitances, said second transconductance amplifier having an output terminal and an inverting output terminal connected to the input terminal and inverting input terminal of said second transconductance amplifier and grounded through capacitances, said third transconductance amplifier having an output terminal and an inverting output terminal connected to an inverting input terminal and an input terminal of said third transconductance amplifier, said fourth transconductance amplifier having an input terminal and an inverting input terminal connected to the output terminal and inverting output terminal of said second transconductance amplifier, said fourth transconductance amplifier having an output terminal and an inverting output terminal connected to the inverting input terminal and input terminal of said second transconductance amplifier.

15. A filter circuit comprising:
a first-order filter circuit comprising first and second transconductance amplifiers,
said first transconductance amplifier having an output terminal and an inverting output terminal connected to an input terminal and an inverting input terminal of said second transconductance amplifier, respectively, and grounded through capacitances, said second transconductance amplifier having an output terminal and an inverting output terminal connected to the inverting input terminal and input terminal of said second transconductance amplifier; and
two fourth-order filter circuits connected in series with said first-order filter circuit, each of said fourth-order filter circuit comprising third to sixth transconductance amplifiers, wherein:
said third transconductance amplifier having an output terminal and an inverting output terminal connected to an input terminal and an inverting input terminal of said fourth transconductance amplifier and grounded through capacitances, said fourth transconductance amplifier having an output terminal and an inverting output terminal connected to the input terminal and inverting input terminal of said fourth transconductance amplifier and grounded through capacitances, said fifth transconductance amplifier having an output terminal and an inverting output terminal connected to an inverting input terminal and an input terminal of said fifth transconductance amplifier, said sixth transconductance amplifier having an input terminal and an inverting input terminal connected to the output terminal and inverting output terminal of said fourth transconductance amplifier, said sixth transconductance amplifier having an output terminal and an inverting output terminal connected to the inverting input terminal and input terminal of said fourth transconductance amplifier,
wherein each of said transconductance amplifiers comprises,
a first and a second voltage/current converting element for converting a first voltage signal to a current signal;
a third and a fourth voltage/current converting element for converting a second voltage signal to a current signal;
an common-mode current generating part for converting each first voltage signals and each second voltage signal to a current signal, and further generating an common-mode current in accordance with an common-mode component of each current signal;
a first current circuit for subtracting the common-mode component by using said common-mode component generating part from each current signal converted by each of said first to fourth voltage/current converting elements;
a second current circuit for supplying a difference between a current signal by using said first voltage/current converting element from which the common-mode component is subtracted by using said first current circuit and a current signal by using said third voltage/current converting element as a first current output; and
a third current circuit for supplying a difference between a current signal by using said fourth voltage/current converting element from which the common-mode component is subtracted by using said first current circuit and a current signal by using said second voltage/current converting element as a second current output.

* * * * *